(12) United States Patent
Desfonds et al.

(10) Patent No.: US 10,297,896 B2
(45) Date of Patent: May 21, 2019

(54) THREE-DIMENSIONAL LC ELECTRICAL RESONATOR DEVICE

(71) Applicants: Universite Paris Diderot Paris 7, Paris (FR); Centre National de la Recherche Scientifique (CNRS), Paris (FR)

(72) Inventors: Pascal Desfonds, Boulogne-Billancourt (FR); Yanko Todorov, Paris (FR); Carlo Sirtori, Paris (FR)

(73) Assignees: Universite Paris Diderot Paris 7 (FR); Centre National de la Recherche Scientifique (CNRS) (FR)

( * ) Notice: Subject to any disclaimer, the term of this patent is extended or adjusted under 35 U.S.C. 154(b) by 71 days.

(21) Appl. No.: 15/553,034

(22) PCT Filed: Feb. 24, 2016

(86) PCT No.: PCT/EP2016/053890
§ 371 (c)(1),
(2) Date: Aug. 23, 2017

(87) PCT Pub. No.: WO2016/135208
PCT Pub. Date: Sep. 1, 2016

(65) Prior Publication Data
US 2018/0248247 A1      Aug. 30, 2018

(30) Foreign Application Priority Data

Feb. 24, 2015 (FR) .................................. 15 51581

(51) Int. Cl.
*H01P 7/08* (2006.01)
*H01P 11/00* (2006.01)
(Continued)

(52) U.S. Cl.
CPC ................ *H01P 7/08* (2013.01); *G02B 1/002* (2013.01); *H01L 23/66* (2013.01); *H01L 28/10* (2013.01);
(Continued)

(58) Field of Classification Search
CPC ....................................................... H01P 7/08
See application file for complete search history.

(56) References Cited

U.S. PATENT DOCUMENTS

2008/0296710 A1* 12/2008 Tonucci .................. G02F 1/015
257/421
2010/0117765 A1* 5/2010 Bourtoutian ........... H01Q 9/285
333/204

FOREIGN PATENT DOCUMENTS

JP        2007273832 A   * 10/2007
JP        2007273832 A     10/2007
WO       2014072335 A1     5/2014

OTHER PUBLICATIONS

International Search Report for Application No. PCT/EP2016/053890, dated Jun. 3, 2016.
(Continued)

*Primary Examiner* — Michael Lebentritt
*Assistant Examiner* — Jordan M Klein
(74) *Attorney, Agent, or Firm* — Lerner, David, Littenberg, Krumholz & Mentlik, LLP

(57) ABSTRACT

The invention relates to a three-dimensional LC electrical resonator device having a given resonant frequency of 100 gigahertz or more, comprising: a separating layer; a first track made of a conductor and comprising two overlapping portions; and a second track made of a conductor, the second track comprising two overlapping portions and an inductive loop connecting the two overlapping portions, the first track and the second track respectively being formed on either side of the separating layer, each overlapping portion of the
(Continued)

first track being placed facing a respective overlapping portion of the second track so as to form two capacitors that are spatially spaced apart from each other.

15 Claims, 18 Drawing Sheets

(51) Int. Cl.
    *H01L 23/66*     (2006.01)
    *G02B 1/00*     (2006.01)
    *H01L 49/02*     (2006.01)
    *H01L 31/02*     (2006.01)
    *H01L 31/0352*     (2006.01)
    *H01L 33/06*     (2010.01)
    *H01L 33/62*     (2010.01)
    *H01P 1/20*     (2006.01)
    *H01P 1/203*     (2006.01)
    *H01P 5/02*     (2006.01)
    *H01Q 15/00*     (2006.01)
    *H01L 21/306*     (2006.01)
    *H01L 21/3205*     (2006.01)

(52) U.S. Cl.
CPC ........ *H01L 28/40* (2013.01); *H01L 31/02005* (2013.01); *H01L 31/02019* (2013.01); *H01L 31/035209* (2013.01); *H01L 33/06* (2013.01); *H01L 33/62* (2013.01); *H01P 7/082* (2013.01); *H01P 11/008* (2013.01); *H01L 21/30612* (2013.01); *H01L 21/32051* (2013.01); *H01L 2223/6627* (2013.01); *H01L 2223/6672* (2013.01); *H01L 2223/6677* (2013.01); *H01P 1/2005* (2013.01); *H01P 1/20372* (2013.01); *H01P 5/028* (2013.01); *H01Q 15/006* (2013.01)

(56) References Cited

OTHER PUBLICATIONS

Paulillo, B., et al., Circuit-tunable sub-wavelength THz resonators: hybridizing optical cavities and loop antennas, Optics Express, Sep. 8, 2014, 11 pages, vol. 22, No. 18.

Hoer, et al., Exact Inductance Equations for Rectangular Conductors With Applications to More Complicated Geometries Journal of Research of the National Bureau of Standards-C. Engineering and Instrumentation, Apr.-Jun. 1965, 127-137, vol. 69C, No. 2.

Palmer, H.B., Capacitance of a Parallel-Plate Capacitance by the Schwartz-Christoffel Transformation, Transactions of the American Institute of Electrical Engineers, Mar. 1937, pp. 363-366, vol. 56, Issue 3.

Bahl, I., Lumped Elements for RF and Microwave Circuits, 2003, p. 458, Artech House, Inc. 685 Canton Street Norwood, MA 02062.

* cited by examiner

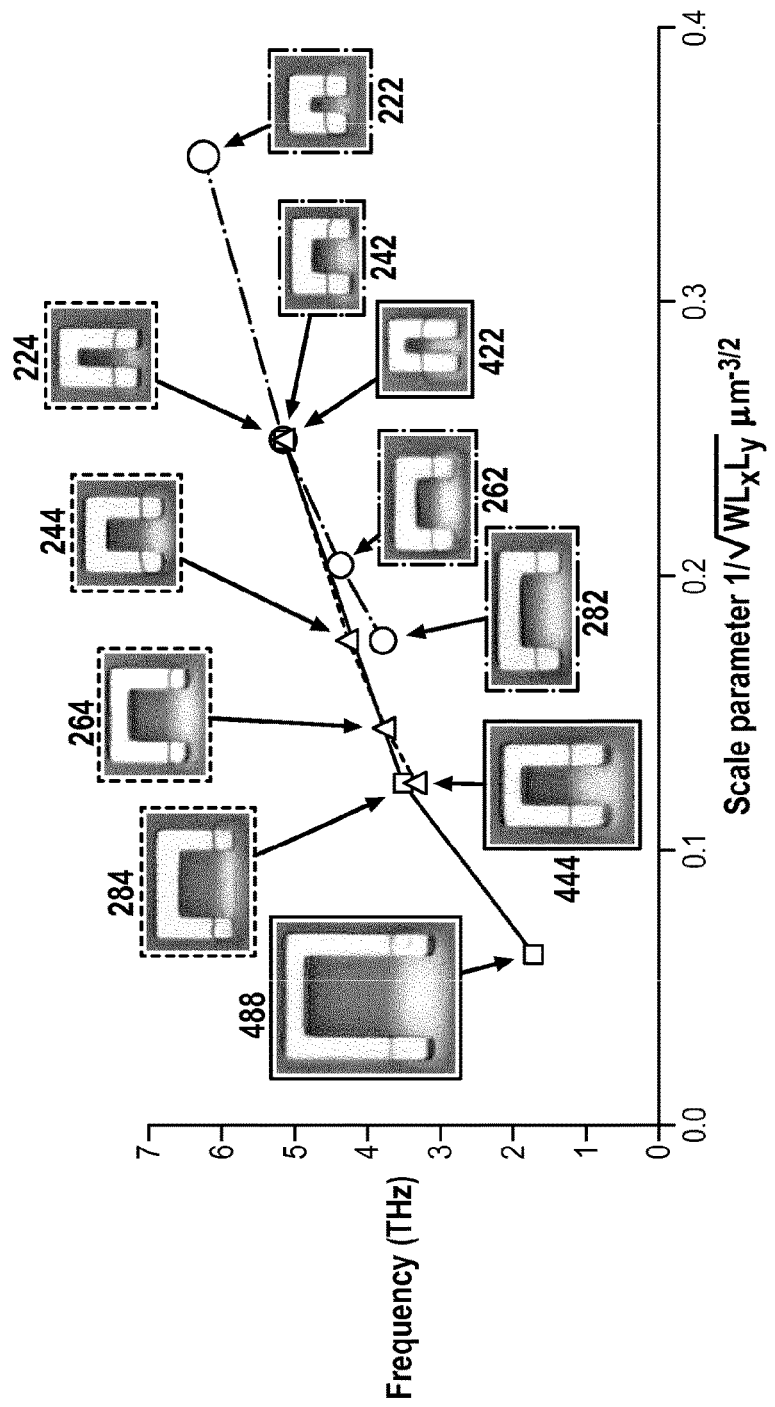

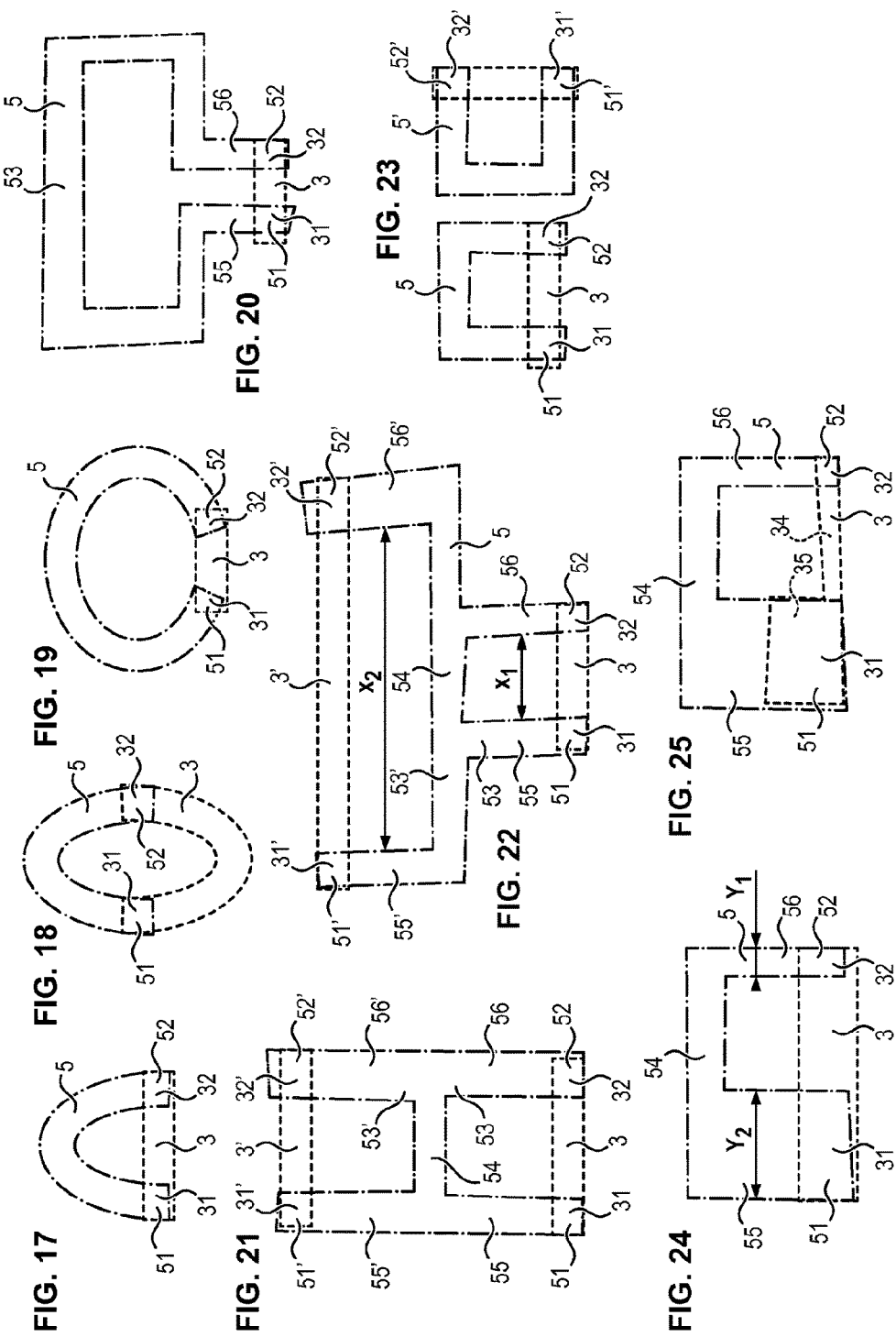

$f_{res}$ = 4.17 THz  $\lambda_{res}$ = 72µm $f_{res}$ = 4.17 THz  $\lambda_{res}$ = 72µm

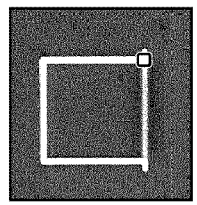
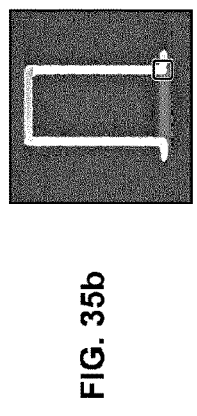
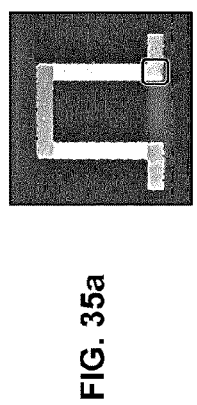
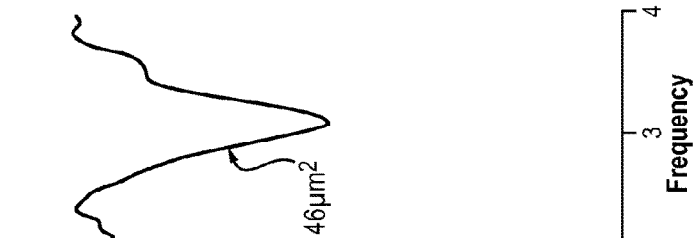
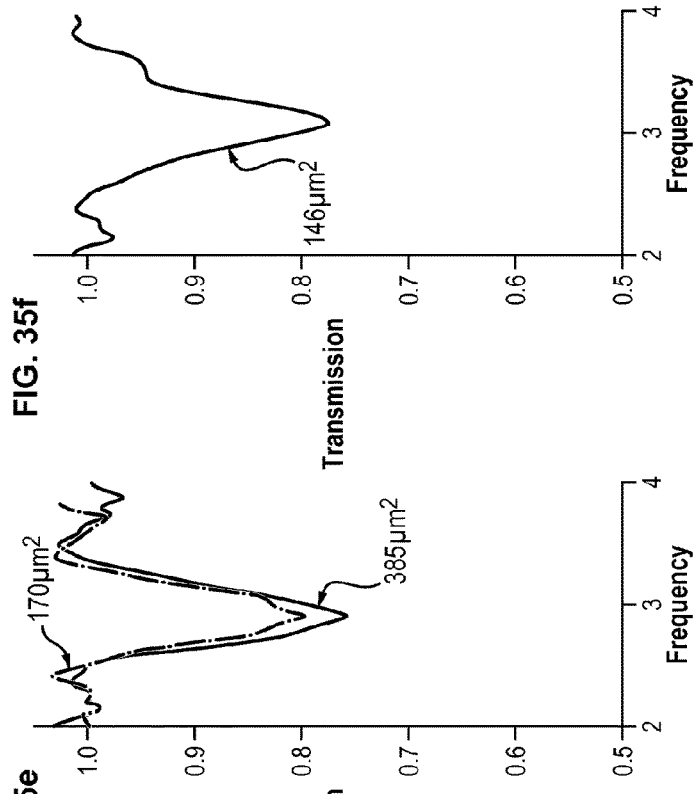
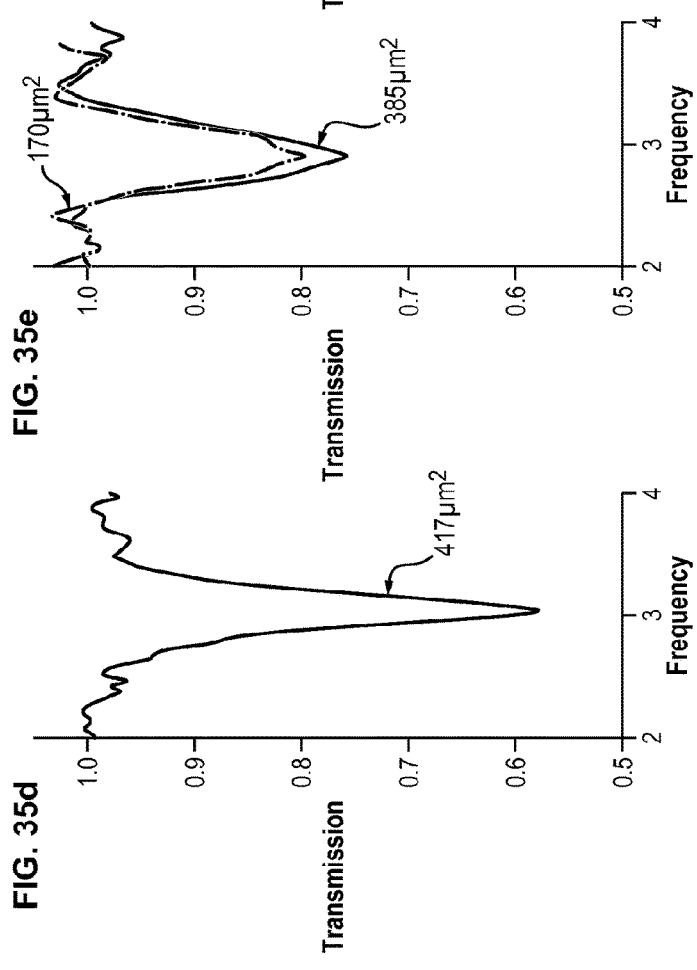
FIG. 35a   FIG. 35b   FIG. 35c
FIG. 35d   FIG. 35e   FIG. 35f

THREE-DIMENSIONAL LC ELECTRICAL RESONATOR DEVICE

CROSS REFERENCE TO RELATED APPLICATIONS

The present application is a national phase entry under 35 U.S.C. § 371 of International Application No. PCT/EP2016/053890 filed Feb. 24, 2016, published in French, which claims priority from French Patent Application No. 1551581 filed Feb. 24, 2015, the disclosures of which are incorporated herein by reference.

TECHNICAL FIELD

The invention relates to a three-dimensional electrical resonator device of inductance-capacitance type for high frequencies (>100 GHz).

PRIOR ART

Resonators of "split-ring" type comprising a metallic track in the form of an open ring are known. These resonators of micrometric dimensions behave as electrical resonators of LC (inductance-capacitance) type. The part in the form of a loop of the metallic track constitutes the inductance L. The part in the form of a loop extends between two ends located facing each other and forming the capacitance C.

These resonators are used especially for making metamaterials, i.e., materials having electromagnetic properties not found in natural material, such as materials having a negative refraction index, for example at a given resonant frequency.

However, these resonators of split-ring type generally have low coupling capacitance with the semiconductor substrate on which the resonator is formed.

In fact, the electrical field generated in the capacitive zone (between the ends of the loop) extends mainly in a direction parallel to the surface of the substrate. The electrical field generated in the capacitive zone is therefore perpendicular to the magnetic field generated by the loop, which favours the effects of propagations. Also, only a fraction of the electrical field generated in the capacitive zone, corresponding to an electrical leakage field is coupled to the semiconductor substrate.

B. Paulillo et al "Circuit-tunable sub-wavelength THz resonators: hybridizing optical cavities and loop antennas", Optics Express, 8 Sep. 2014, vol. 22, no. 18, describes a resonator device comprising two metallic layers positioned facing each other, and a loop antenna connecting the two metallic layers. The two metallic layers form a capacitive zone, and the loop antenna forms an inductive zone, such that the resonator device behaves like an LC circuit. The loop antenna is formed by suspended metallisation which can be manufactured by a process of micro-machining currently used to produce air bridge structures. The resonant frequency of the resonator device can be adjusted by modifying the geometric parameters of the loop antenna or the metallic layers. The capacitive zone can house active material, and can be an emitter (for example an unipolar quantum cascade laser—QC), a detector (a quantum-well infrared detector—QWIP), or an absorber (a quantum well for polaritonic applications, for example).

The resonator device proposed in this document has the advantage that the electrical field generated by the capacitive zone is located mainly in the active material, which improves coupling of the resonator device with the active material.

However, the electrical field generated in the capacitive zone is perpendicular to the magnetic field generated by the loop antenna, which does not exclude the effects of propagation.

Also, it is not possible to simply connect the device to a current generator or to a current detector to detect a current extracted from the device.

SUMMARY OF THE INVENTION

An aim of the invention is to propose a resonator device capable of functioning in the high frequencies (greater than or equal to 100 GigaHz) having improved coupling capacitances.

Another aim of the invention is to propose a resonator device for easy connection to a current generator or with a current detector.

This aim is achieved in terms of the present invention by way of a three-dimensional electrical resonator device of inductance-capacitance type, having a given resonant frequency greater than or equal to 100 gigahertz, comprising:
 a separating layer,
 a first track made of conductive material and a second track made of conductive material, the first track and the second track being formed respectively on either side of the separating layer,
 the first track having two overlapping parts, and
 the second track having two overlapping parts and an inductive loop connecting the two overlapping parts,
 each overlapping part of the first track being positioned facing a respective overlapping part of the second track so as to form two capacitances, spaced apart spatially from each other,
 the inductive loop being suitable for generating a magnetic field inside the inductive loop and around the tracks, and each capacitance being suitable for generating an electrical field inside the separating layer when the device is excited at the resonant frequency.

With such a device, the magnetic field generated by the inductive loop in the separating layer has a main component extending in a direction parallel to the electrical field generated by the capacitances. In other words, in the separating layer the projection of the field H in the direction of the electrical field E is greater in absolute value than the other projections of the field H.

This characteristic excludes the propagation phenomenon. It follows that the resonator device functions in quasistatic state. In such a state, the dimensions of the resonator can be very small relative to the resonance wavelength of the device.

In a "quasistatic state", the source of the magnetic field is essentially the current which circulates in the tracks made of conductive material, and not the variations in electrical field over time, also known as "displacement current".

To obtain a quasistatic state, the size of the resonator must be smaller than the resonance wavelength. Also, for a given geometry, quasistatic modes are favoured if, by the design of the structures, the fields E and H are restricted from being parallel and/or being located in different volumes.

Also, in such a resonator device, the two tracks can be easily connected to a current generator or a current detector.

The electrical field generated by each capacitance extends in a direction parallel to the direction of the thickness of the separating layer, which integrates active material into the separating layer.

The inductance and the capacitance of the device can be adjusted independently of each other so as to obtain the preferred resonant frequency. In particular, it is possible to reduce the dimensions of the overlapping parts so as to concentrate the electrical field in small-sized zones of the separating layer, leading to obtaining an electrical field of strong intensity in these zones.

The resonator device can further have the following characteristics:
  the separating layer comprises a quantum heterostructure positioned between an overlapping part of the first track and an overlapping part of the second track,
  the quantum heterostructure comprises a stack of layers of a first semi-conductor material and a second semi-conductor material, different to the first material, positioned alternately, each layer of the stack extending perpendicularly to the direction of the thickness of the separating layer,
  the first and the second material are selected from: GaAs and $Ga_{1-x}AlAs$, GaAs and AlGaAs, InAs and AlSb, GaN, and AlGaN, GaN and InGaN, or any other couple of alloys of the elements III-V of the periodic table, and elements such as Si, Ge, C . . . .
  in addition, the first and the second material can also be selected by an alloy of the elements II-VI of the periodic table, such as HgTe.
  at least 70% of the electrical energy generated by the electrical field is located in zones of the separating layer located between the overlapping parts of the first track and of the second track,
  the separating layer has a first thickness in a first zone located between the overlapping parts of the first track and of the second track forming one of the capacitances, and a second thickness in a second zone located between the overlapping parts of the first track and of the second track forming the other of the capacitances, the second thickness being different to the first thickness,
  the overlapping parts of the second track are spaced apart from each other by a spacing distance, and the separating layer has a thickness equal to or less than the spacing distance,
  the overlapping parts of the second track are spaced apart from each other by a spacing distance $L_x$, the inductive loop has a longitudinal dimension $L_y$, each overlapping part has a length W and a width Y. The dimensions $L_x+2Y$ and $L_y+W+Y$ are less than the wavelength of the resonance $\lambda$. The resonance wavelength $\lambda$ is defined as being equal to $c/f_{res}$, where c is the speed of light in the vacuum and $f_{res}$ is the resonant frequency of the device,
  the thickness of the separating layer is less than $\lambda/2n$, where n is the refraction index of the separating layer and $\lambda$ is the resonance wavelength, $\lambda$ being equal to $c/f_{res}$, where c is the speed of light in the vacuum and $f_{res}$ is the resonant frequency of the device,
  the resonant frequency is greater than or equal to 100 gigahertz and the device functions in quasistatic state at the resonant frequency (in a "quasistatic state", the source of the magnetic field is essentially the current which circulates in the conductive tracks, and not the variations in the electrical field over time, also known as "displacement current"),
  the device has one or more resonance frequencie(s) of between 0.1 and 300 terahertz,
  each zone of the separating layer located between the overlapping parts of the first track and of the second track forming a capacitance has a volume less than or equal to $(\lambda/2n)^3$, where n is the refraction index of the separating layer and $\Delta$ is the resonance wavelength, $\Delta$ being equal to $c/f_{res}$, where c is the speed of light in the vacuum and $f_{res}$ is the resonant frequency of the device,
  the first conductive track has a rectilinear form,
  the second conductive track has a U-shape having two parallel branches, the overlapping parts being located at the respective ends of the U-shaped branches,
  the second track has an asymmetrical form,
  each conductive track has an extension part for connecting the conductive tracks to a current source to feed the device, or to a current detector for detecting a current extracted from the device,
  the device comprises a metallic pattern, forming an antenna, coupled capacitively or inductively with the second conductive track, the metallic pattern being suitable for collecting electromagnetic radiation lighting the device.

The invention also relates to an electrical resonator assembly, comprising a plurality of devices such as defined previously, a first electrical conductor electrically connecting the first tracks together and a second electrical conductor connecting the second tracks together.

PRESENTATION OF THE FIGURES

Other characteristics and advantages will emerge from the following description which is purely illustrative and non-limiting, and must be considered in terms of the appended figures, in which:

FIG. 1 schematically illustrates a resonator device according to an embodiment of the invention, FIG. 2 schematically illustrates the dimensions of the device, FIG. 3 schematically illustrates the magnetic field and the electrical field generated by the device, FIG. 4 schematically illustrates distribution of the electrical field generated in a plane (x, y) for a first example of a resonator, FIG. 5 schematically illustrates distribution of the magnetic field in the plane (x, y) for the first example of a resonator, FIG. 6 schematically illustrates an example of a resonator device made on a substrate made of GaAs with a separating layer made of $SiO_2$, and metallic parts made of Gold, FIG. 7 schematically illustrates a matrix of resonator devices, FIGS. 8A to 8C are spectra of reflectivity obtained for matrices of resonator devices having different sets of parameters, FIG. 9 is a diagram showing the frequencies in resonance measured for different geometries of the resonator device, distributed in three families, FIG. 10 is a comparative diagram showing the experimental frequencies for the three families of resonator devices and the corresponding resonance frequencies obtained by digital simulation, FIGS. 11A to 11B schematically illustrate an equivalent electrical circuit, FIG. 12 schematically illustrates a resonator device comprising a first quantum structure, FIG. 13 schematically illustrates a resonator device comprising a second quantum structure, FIG. 14 schematically illustrates a resonator device comprising a first antenna coupled inductively with a track of the resonator device, FIG. 15 schematically illustrates a resonator device comprising a second antenna coupled capacitively to a track of the resonator device.

FIG. 16 schematically illustrates a resonator device according to a second embodiment of the invention, FIGS. 17 to 25 schematically illustrate different embodiments of a resonator device according to the invention, FIGS. 26A to 26G schematically illustrate steps of a production process of a resonator device according to the invention, FIG. 27 schematically illustrates a distribution of the electrical field generated in a plane (x, y) for a second example of a resonator, FIG. 28 schematically illustrates a distribution of the magnetic field in the plane (x, y) for the second example of a resonator, FIG. 29 schematically illustrates a distribution of the electrical field generated in a plane (x, y) for a third example of a resonator, FIG. 30 schematically illustrates a distribution of the magnetic field in the plane (x, y) for the third example of a resonator.

FIG. 31 schematically illustrates the projection in the plane of the upper metallic loop of the electrical field generated at the frequency of the device for a first realisation.

FIG. 32 schematically illustrates projection in the plane of the upper metallic loop of the electrical field generated at the frequency of the device for a second realisation.

FIGS. 35A to 35F show embodiments of resonators with very small capacitance volumes, as well as spectra realised on networks of these types of resonators.

DESCRIPTION OF AN EMBODIMENT

Figure 1:
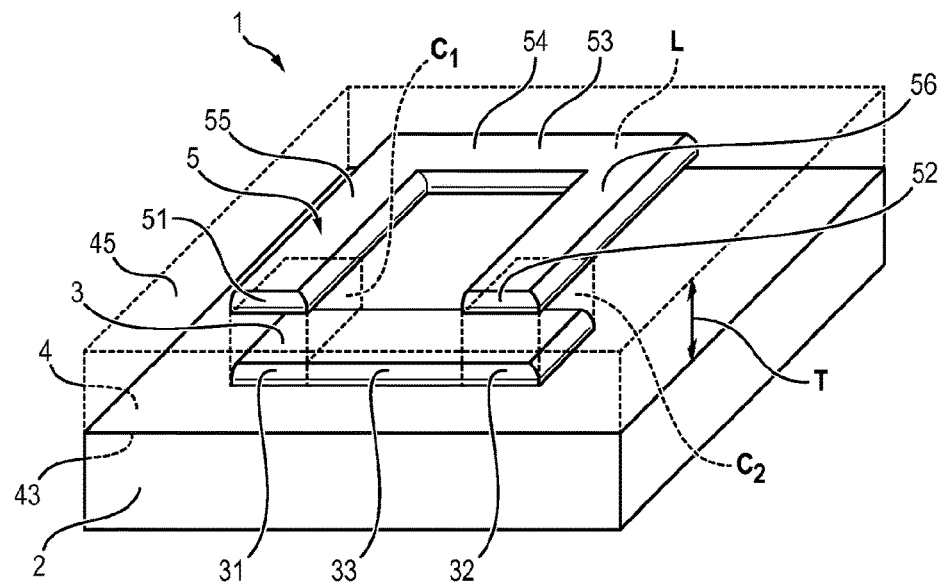

In FIG. 1, the resonator device 1 illustrated comprises a substrate 2, a first conductive track 3, a separating layer 4 and a second conductive track 5.

The substrate 2 is formed in semiconductor material, such as gallium arsenide (GaAs), indium phosphide (InP) or silicon (Si), for example.

The first conductive track 3 is formed from metal, for example by deposit of one or more metallic layer(s) on the substrate 2. The metal used to form the layers can be gold, titanium, platinum, nickel, or germanium or alloys of these metals, or again superconductor material at high temperature (such as for example, $YBa_2Cu_3O_{7-x}$). The first track 3 has an elongated rectilinear form, generally rectangular. The first track 3 comprises a first end part 31, a second end part 32 and an intermediate part 33 connecting two end parts 31, 32 together.

The separating layer 4 is formed from dielectrical material, such as silicon dioxide ($SiO_2$), silicon nitride ($Si_3N_4$), or a quantum heterostructure based on semiconductor materials, for example. The separating layer 4 can also be formed by a stack of layers of the above materials, whereof one of the layers is graphene. The separating layer 4 has a general planar form with a first face 43 and a second face 45, opposite the first face 43.

The second conductive track 5 is also formed from metal, for example by deposit of a metallic layer on the separating layer 4. The second conductive track 5 can be formed from the same metal as the first conductive track 3. The second conductive track 5 comprises a first end part 51, a second end part 52 and an intermediate part 53 in the form of a loop (of pin) connecting the two end parts 51, 52 together. In the embodiment illustrated in FIG. 1 the second track 5 has an overall U-shape with a transversal branch 54 and two parallel longitudinal branches 55, 56.

The first track 3 is positioned in contact with the first face 43 of the separating layer 4, whereas the second track 5 is positioned in contact with the second face 45 of the separating layer 4. In other words, the first and the second tracks 3 and 5 are positioned respectively on either side of the separating layer 4.

Also, the first track 3 and the second track 5 are positioned relative to each other such that the first end part 51 of the second track 5 overlaps the first end part 31 of the first track 3, and the second end part 52 of the second track 5 overlaps the second end part 32 of the first track 3.

In this way, the two first end parts 31, 51 form a first capacitance C, and the two second end parts 32, 52 form a second capacitance $C_2$, with the first capacitance and the second capacitance being spaced spatially apart from each other. Also, the end parts 51 and 52 form a third capacitance $C_{fringe}$.

Also, the part in the form of a loop 53 of the second track forms an inductance L.

The device 1 behaves like an electric resonator circuit of inductance-capacitance type. The resonant frequency $f_{res}$ of the device 1 depends on the dimensions of the first track 3 and the second track 5 as well as the dimensions of the end parts 31, 51, 32, 52 which overlap.

Figure 2:
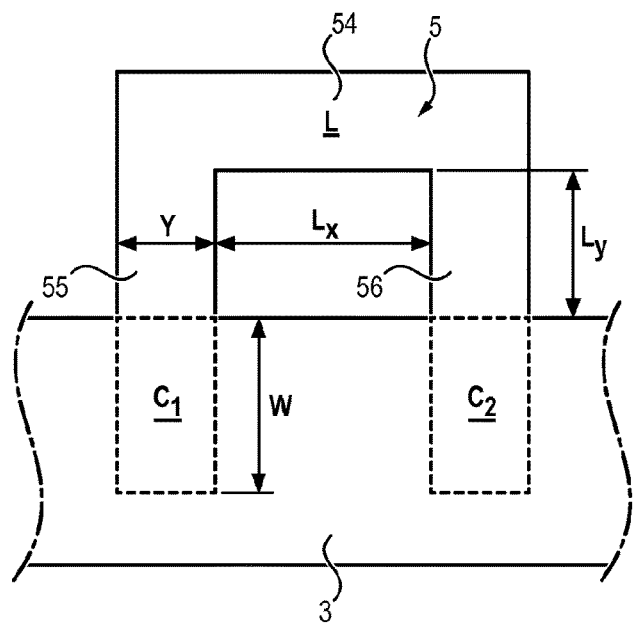

As illustrated in FIGS. 1 and 2, the geometric parameters of the device 1 are the following:

T: thickness of the separating layer 4,
Y: width of the end parts 31, 32, 51, 52 which overlap,
W: length of the end parts 31, 32, 51, 52 which overlap,
Y×W: area of overlap of each end part of the second track 5 with the first track 3,
$L_x$: length of the transversal branch 54 of the part in the form of a loop 53,
L: length of a longitudinal branch 55, 56 of the part in the form of a loop (excluding the end parts 31, 32, 51, 52 which overlap),
$L_x+2\times L_y$: total length of the part in the form of a loop 53 (excluding the end parts 31, 32, 51, 52 which overlap).

Since the device 1 is symmetrical, the capacitances $C_1$ and $C_2$ are identical. Also, the total capacitance of the device is:

$$C=C_{fringe}+(1/C_1+1/C_2)^{-1}$$

The capacitance C of the device 1 depends on the geometric parameters Y, W and T. The inductance L of the device depends on the geometric parameters $L_x$, $L_y$, Y, W and T.

The resonant frequency $f_{res}$ of the device is expressed as:

$$f_{res} = \frac{1}{2\pi\sqrt{LC}}$$

The natural frequency $f_{res}$ can be allowed in the terahertz frequency range by an appropriate choice of geometric parameters Y, W, T, $L_x$ and $L_y$.

Figure 3:
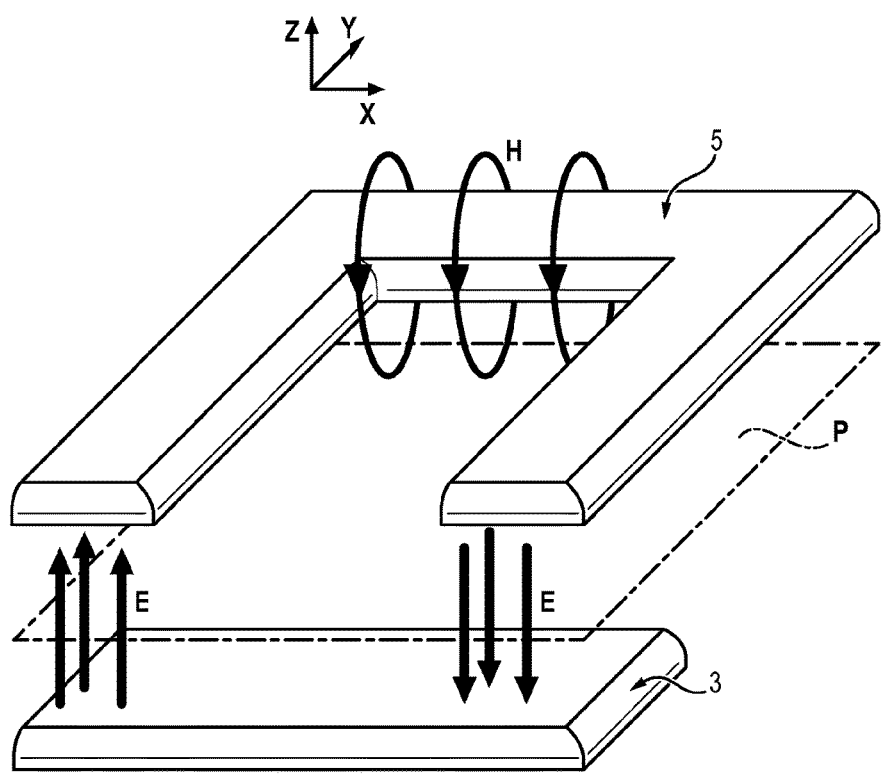

As illustrated in FIG. 3, when the device 1 is excited at its resonant frequency $f_{res}$, each capacitance generates an electrical field E inside the separating layer 4, the electrical field E generated has a main direction parallel to the thickness of the separating layer 4 (i.e., perpendicular to the faces 41 and 42 of the separating layer 4).

Also, the part in the form of a loop 53 of the second track 5 generates a magnetic field H around the part in the form of a loop 53. The part of the magnetic field H generated inside the loop has also a direction parallel to the thickness of the separating layer 4 (i.e., perpendicular to the faces 41 and 42 of the separating layer 4).

In this way, the magnetic field H generated by the part in the form of a loop 53 in the separating layer 4 has a non-zero main component $H_z$ extending in a direction parallel to the thickness of the separating layer 4, and parallel to the main component of the electrical field $E_z$ generated by the capacitances $C_1$ and $C_2$. Also, in the separating layer 4, the component $H_z$ is greater than the other components of the field $H_y$ and $H_x$. For example, digital simulation with a device having the geometric parameters T=W=Y=2 µm, and $L_x=L_y=2$ µm shows that the component $H_z$ is almost homogeneous in the surface of the loop, and $H_z/H_x=1.6$ and $H_z/H_y=1.4$.

EXAMPLE 1

Digital simulation of the operation of the resonator device 1 was performed.

The geometric parameters used for the simulation are the following: T=W=Y=2 µm and $L_x=L_y=4$ µm. The separating layer 4 is a layer made of dielectrical material of optical index $n_1=2$. The substrate 2 has an optical index $n_2=3.5$. A commercial digital simulator based on the method of finite elements determines that the resonant frequency of such a device is equal to $f_{res}=4.2$ THz.

Figure 4:
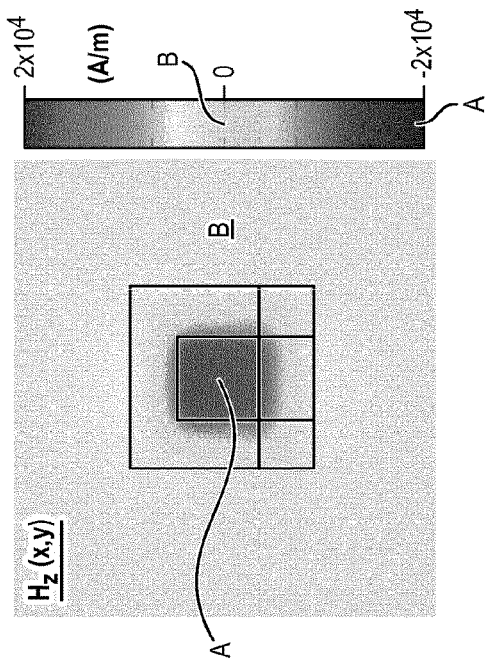

FIG. 4 schematically illustrates the intensity of the component $E_z$ of the electrical field generated, along the direction z parallel to the thickness of the separating layer 4. FIG. 4 shows 3D digital simulation of the distribution of the component $E_z$ (x, y) in a plane P (x, y) parallel to the faces 41 and 42 of the separating layer 4 and passing through the middle of the separating layer 4. In other words, the plane P is a median plane perpendicular to the thickness of the separating layer 4.

Figure 5:
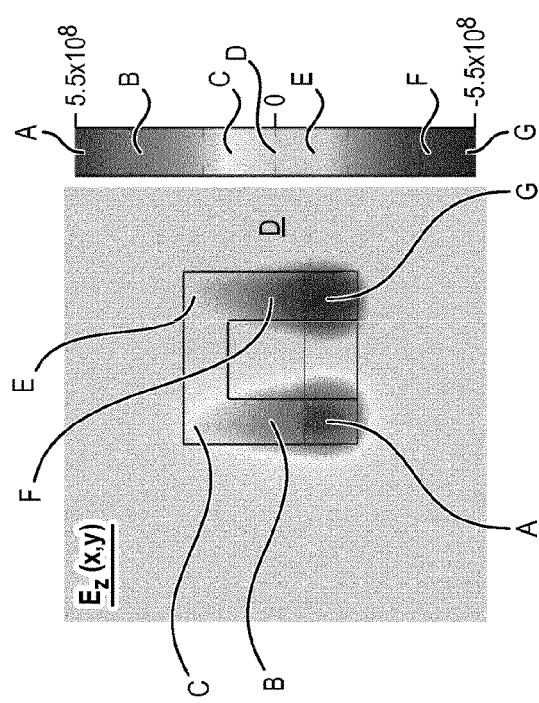

FIG. 5 schematically illustrates the intensity of the component $H_z$ of the magnetic field generated, along the direction z parallel to the thickness of the separating layer 4. FIG. 5 shows 3D digital simulation of the distribution of the component $H_z(x, y)$ in the median plane P (x, y) which passes through the middle of the separating layer 4 (for example dielectrical), equidistant from the conductive tracks 3 and 5.

Most of the electrical energy (proportional to the square of fields ($|E_z|^2$) is stored in the component $E_z$, and most of the magnetic energy (proportional to the square of fields ($|H_z|^2$) is stored in the component $H_z$.

The other components of the electrical field are negligible relative to $E_z$ (for example $E_z/E_y$ is near 4) and the other components of the magnetic field are less than $H_z$ in the separating layer.

As illustrated in FIGS. 4 and 5, the electrical field $E_z$ (x, y) generated by the resonator device is concentrated in the volume T×W×Y of the separating layer 4 located between the end parts 31, 51 and 32, 52 of the first track 3 and of the second track 5 which overlap (this volume is called capacitive zones). However, the magnetic field $H_z(x, y)$ is located around the part in the form of a loop $L_x \times L_y$ of the second track 5 (this part is called inductive zone). The magnetic field H is thus spatially separated from the electrical field E.

The geometry of the resonator device 1 independently adjusts the capacitance C and the inductance L from the resonator device. For a given natural frequency $f_{res}$, it is possible to adjust the geometric parameters, so as to obtain low capacitance C and strong inductance L. This independently adjusts the electrical component $E_z$ and the magnetic component $H_z$ of the field generated in the separating layer 4.

In particular, it is possible to reduce the zone T×W×Y at the expense of the loop $L_x \times L_y$ to reduce the volume occupied by the electrical field, and retain the same resonant frequency $f_{res}$.

EXAMPLES 2 AND 3

This property is also illustrated by digital simulations of two other examples of devices presented in FIGS. 27 to 30.

Figure 27:
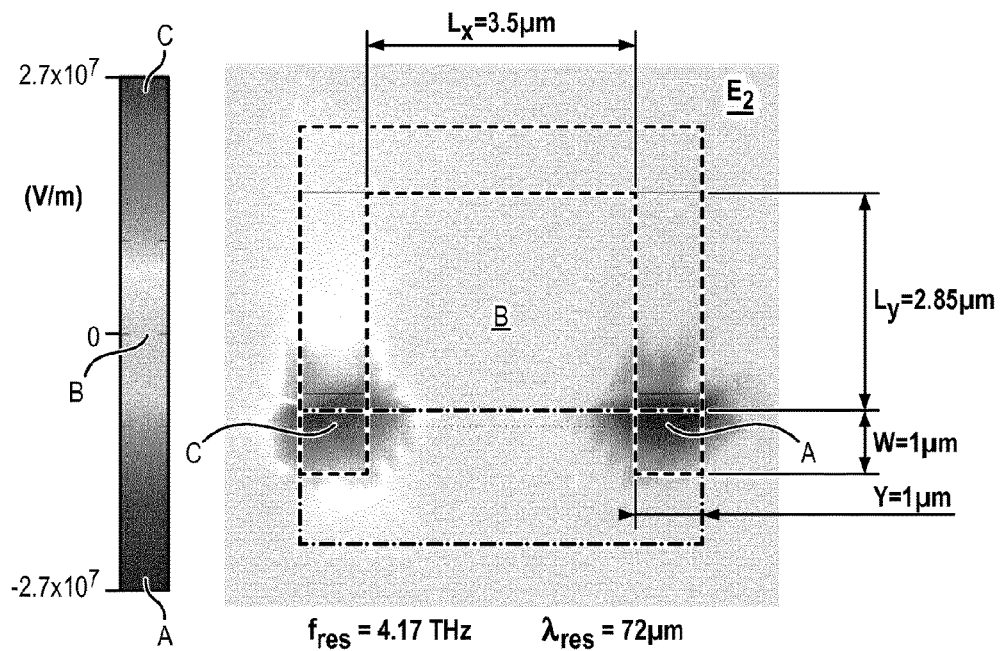
Figure 28:
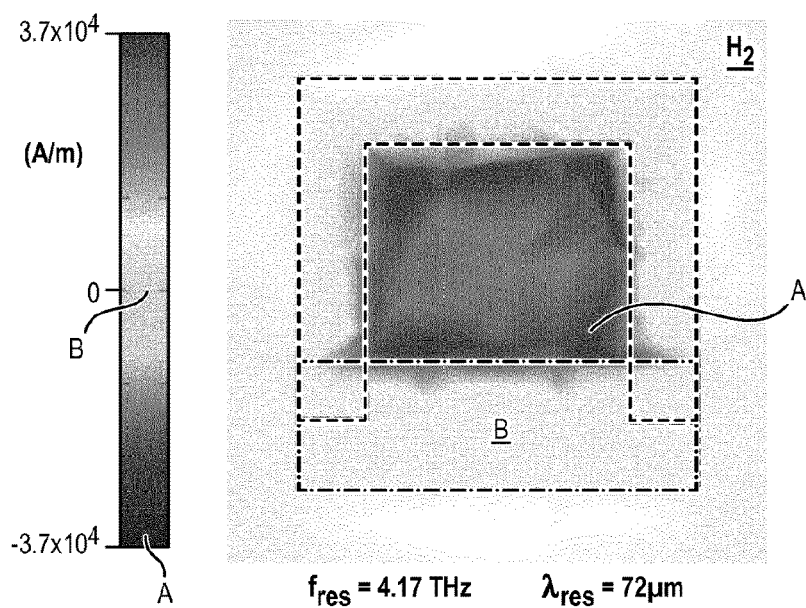

The device illustrated in FIGS. 27 and 28 has the following geometric parameters: $L_x=3.5$ µm, $L_y=2.85$ µm, W=1 µm, Y=1 µm and T=0.5 µm. This device has a resonant frequency $f_{res}=4.17$ THz.

Figure 29:
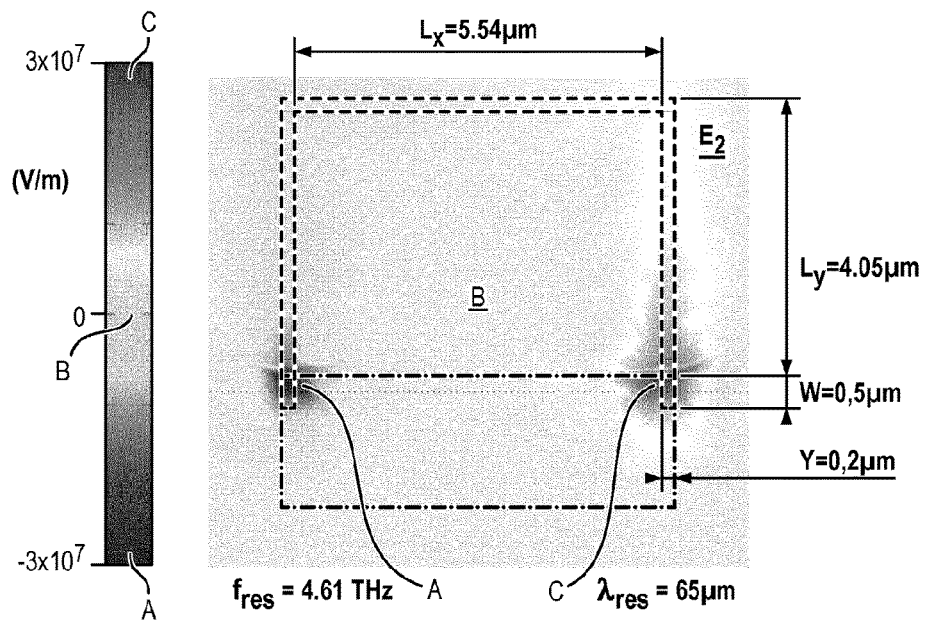
Figure 30:
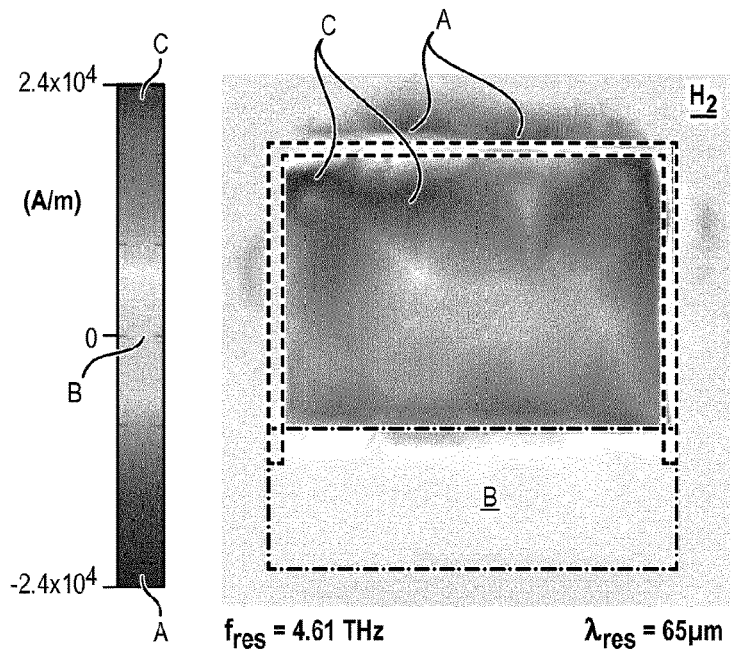

The device illustrated in FIGS. 29 and 30 has the following geometric parameters: $L_x=5.54$ µm, $L_y=4.05$ µm, W=0.2 µm, Y=0.5 µm and T=0.5 µm. This device has a resonant frequency $f_{res}=4.61$ THz.

The three examples of devices in FIGS. 4 and 5, 27 and 28, 29 and 30 therefore have frequencies of similar resonances, while the zone occupied by the electrical field is progressively reduced from T×W×Y=8 µm³ (FIGS. 4 and 5) to T×W×Y=0.05 µm³ (FIGS. 29 and 30).

So, the spatial separation of the electrical and magnetic fields has the ratio vary between the dimensions of the inductive loop and those of the capacitive zones.

Also, if the fields E and H are spatially separate, then E is inversely proportional to the square root of the volume of the capacitive parts, as described hereinbelow.

The device concentrates the electrical field E in a very small volume $V_c$=T×W×Y relative to the diffraction limit $\lambda_{res}^3$, where $$\lambda_{res} = \frac{c}{f_{res}}$$

is the resonance wavelength and c is the speed of light in the vacuum.

For example, with the device illustrated in FIGS. 29 and 30, a ratio $$\frac{\lambda_{res}^3}{V_c} = 5,5.10^6$$

is obtained.

Because of this property, it is possible to obtain considerable values of intensity of the electrical field $E_z$. In fact, when the resonator device is excited at its natural frequency $f_{res}$, the device is capable of storing a finite electromagnetic energy U, half of this energy being electrical nature and verifying the relation:

$$\varepsilon\varepsilon_0 E_z^2 V_c = 2 \times U = \text{constante}$$

where $\varepsilon = n_1$ and $\varepsilon_0 = 8,854 \cdot 10^{-12}$ F/M is the dielectrical constant (or permittivity of the vacuum).

In the proposed resonator device 1, the geometric parameters T, W and Y of the capacitive zones can be reduced, such that for given electromagnetic energy U, the electrical field $E_z$ can be augmented.

Also, in this resonator device 1 the electrical field E and the magnetic field H are parallel to each other, which shows that the resonance of the device is not linked to effects of propagation as are most known optoelectronic resonator devices.

The device has two metallic tracks of different shape and separated by a quantum heterostructure, which resonate together to make a concentric electrical field in the quantum heterostructure separate from the magnetic field and parallel to the latter, which is not described by any document in the prior art.

In the invention, there is an inductance capacitance resonance, since:
i) The metallic tracks are finite, which allows accumulation of charges near the overlapping end parts 31, 32, 51, 52. Also, it is enough for one of the pairs (31, 32) or (51, 52) to be located in the ends of one of the parts 3 or 5, but not necessarily both at once.
ii) The number of overlapping end parts 31, 32, 51, 52 is a pair (two or a multiple of 2).

Therefore, conditions i) and ii) allows accumulation of electrical charges of opposite signs in:
between the parts 51 and 52 of the first track 3, on the one hand;
between the parts 31 and 32 of the second track 5, on the other hand.

Also, the charges accumulated in the overlapping parts between the end 51 and the end 31 on the one hand, and between the end 52 and the end 32 on the other hand are of opposite signs.

In fact, retaining charges shows that the total sum of the charges in the same track must be zero.

Only in this case, where there is formation of poles of opposite charges between two ends 31, 51, and 32, 52 facing the two tracks, does the device create the capacitance.

What is illustrated in FIG. 3 and on the value of the positive electrical field in A and negative in G, in FIGS. 4, C and A in FIGS. 27, A and C in FIG. 29.

There is out-and-back movement (or oscillation) of electrical charges in each metallic track, and opposite between the two metallic tracks, at the resonant frequency of the three-dimensional resonator.

OTHER EXAMPLES

Figure 6:
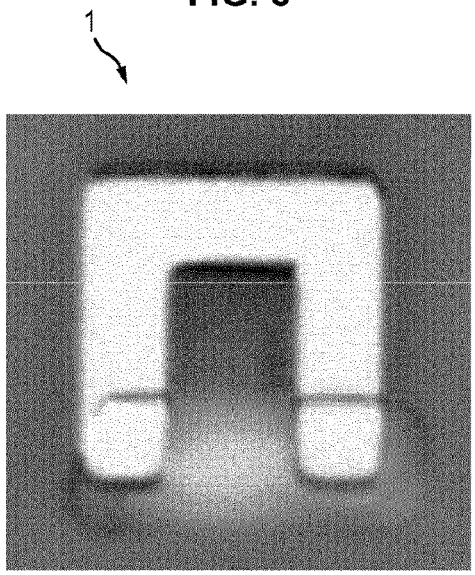

Prototypes of resonator devices were made with the following geometric parameters: T=Y=2 μm, W, $L_x$ and $L_y$ assuming values of 2 μm, 4 μm, 6 μm and 8 μm. FIG. 6 illustrates one of the resonator devices.

Each resonator device comprises a substrate of GaAs, a separating layer of $SiO_2$, and conductive tracks of gold. A particular geometry is noted with a triplet of values W, $L_x$, $L_y$. For example, the triplet "242" designates a resonator device having the following geometric parameters: W=2 μm, $L_x$=4 μm and $L_y$=2 μm.

Figure 7:
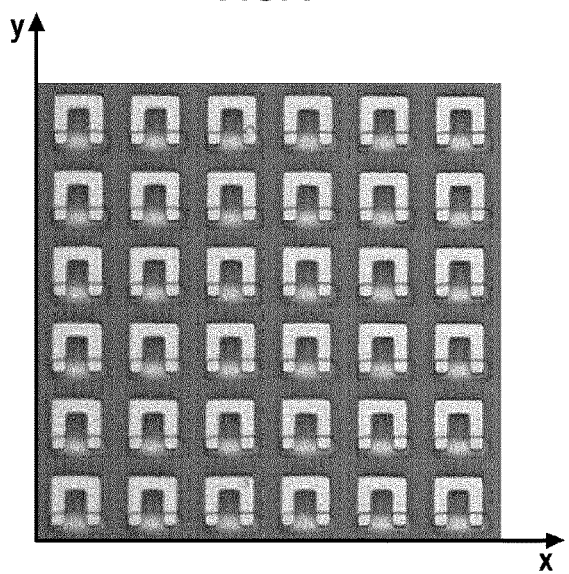

For each set of parameters (W, $L_x$, $L_y$), matrices of devices were produced by having a large number of resonator devices on panels having dimensions 3 mm×3 mm. Each panel supports a matrix of identical resonators, arranged according to a periodic arrangement. FIG. 7 illustrates one of the resonator matrices devices made this way.

Reflectivity measurements were then taken on each panel. Using a periodic arrangement of identical resonator devices 1 reveals the resonance frequencies.

Figure 8A:
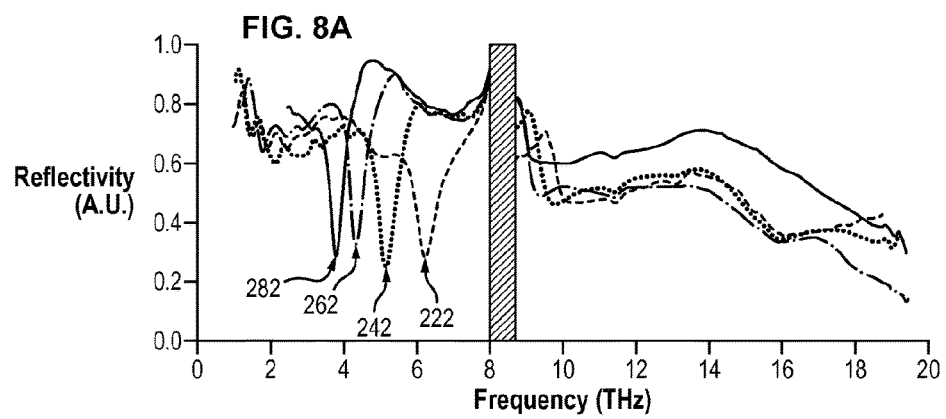
Figure 8B:
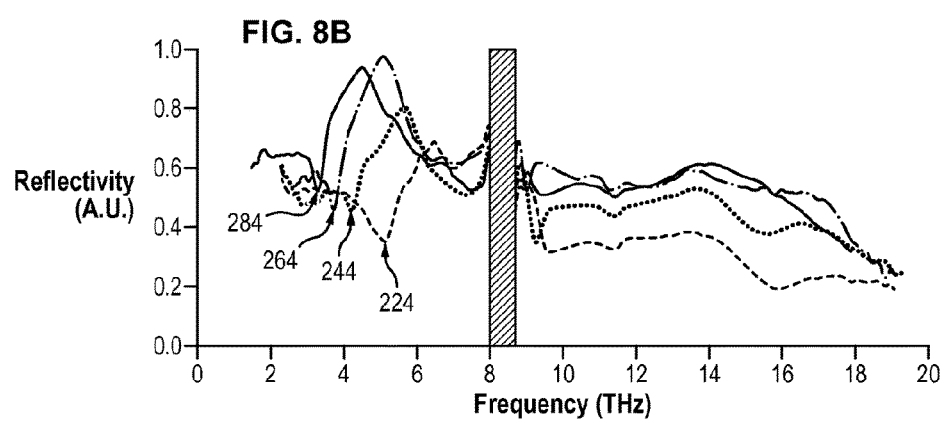
Figure 8C:
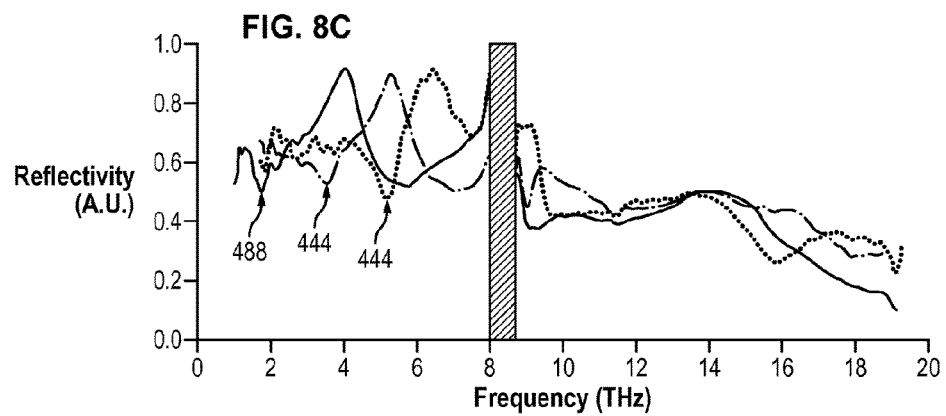

FIGS. 8A to 8C show the reflectivity spectra obtained for the different matrices of resonator devices having different sets of parameters. The spectra were obtained in quasi normal incidence on the panels, with polarised light, the vector of the electrical field of the light being oriented parallel to the length of the earth track 3.

The spectra shown in FIGS. 8A to 8C present reflectivity minima corresponding to resonant absorption of light by resonator devices. In these spectra, no mode of upper order is evident, while in most resonator devices THz studied in reflectivity, modes of upper orders due to the effects of propagation are always present.

FIG. 9 is a diagram combining the resonance frequencies measured for the different geometries of the resonator device, as a function of a parameter of scale:

$$p = \frac{1}{\sqrt{WL_xL_y}}.$$

The meaning of this scale parameter can be understood as follows. If the inductive loop 5 is assimilated into a filiform conductor, and the capacitive parts 51/31 and 52/32 into planar condensers, then the capacitances C and the inductance L are expressed as a first approximation according to the formulas:

$$C = \varepsilon\varepsilon_0 \frac{WY}{T}$$

$$L = \mu_0 \frac{L_xL_y}{h}$$

where h is the thickness of the second conductive track (h=0.25 μm in the present examples) and $\mu_0$ is the magnetic constant ($\mu_0 = 4\pi \cdot 10^{-7}$ T·m/A).

Since the geometric parameters Y, T and H are fixed, the resonant frequency is expressed as:

$$f_{res} = \frac{1}{2\pi\sqrt{CL}} \approx \frac{1}{2\pi\sqrt{WL_xL_y}} c\sqrt{\frac{Th}{Y}} = p \times Const$$

In first approximation, the resonant frequency is therefore proportional to the parameter p.

It is in fact possible to observe that the resonator devices having the same product $W \times L_x \times L_y$ present identical resonance frequencies.

For example, as seen in FIG. 9, the resonator devices "224", "242" and "422" resonate at the same frequency $f_{res}$=4.5 THz. It is possible to increase dimensions of each capacitance by a factor 2 (moving from W=4 μm for the resonator device "422" to W=2 μm for the resonator device "224"), and retain the same resonant frequency.

Figure 10:
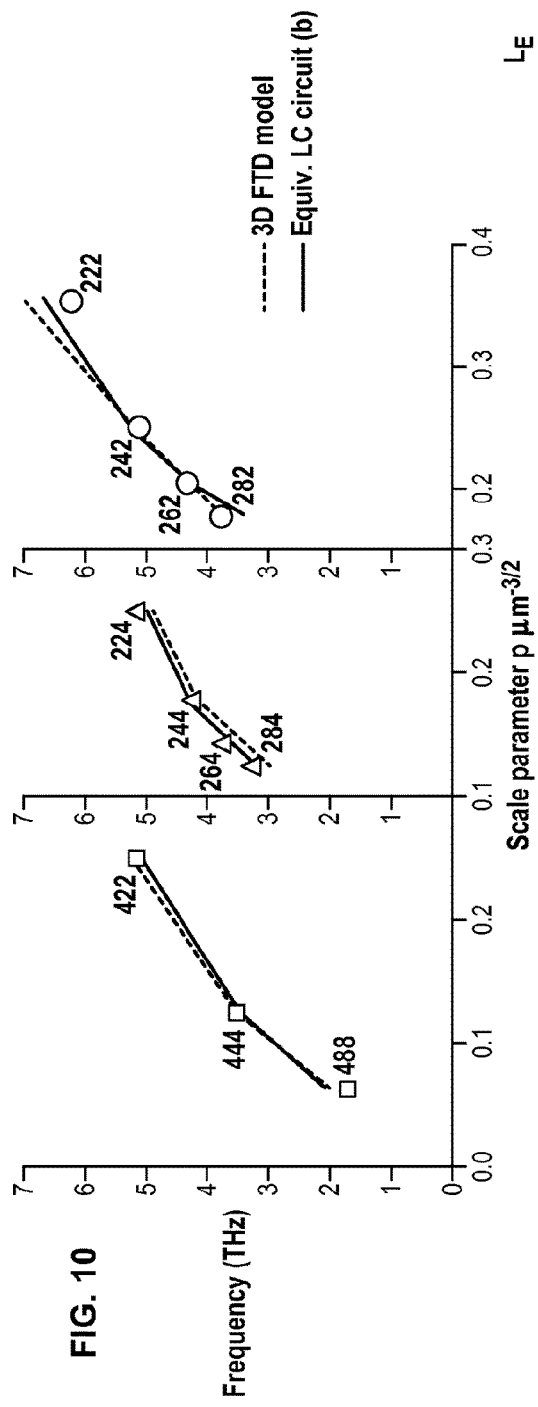

FIG. 10 is a comparative diagram showing the experimental frequencies for the three families of resonator devices and the corresponding resonance frequencies obtained by two different methods. The first method is electromagnetic digital simulation of the structure by the method of finite elements (curves in dotted lines in FIG. 11).

Figure 11A:
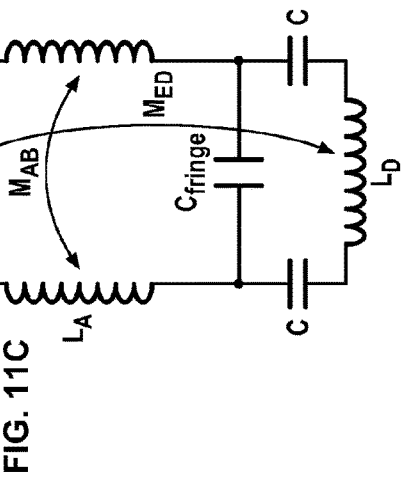
Figure 11B:
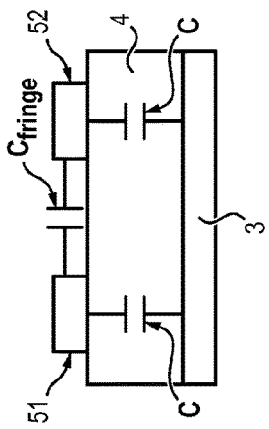
Figure 11C:
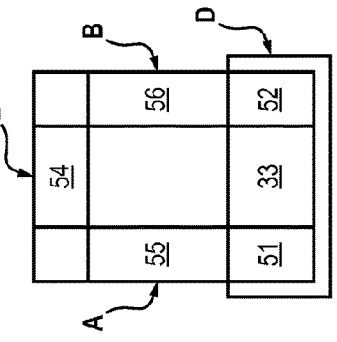

The second method is analytic expression of the resonant frequency based on an equivalent circuit (FIGS. 11A to 11C).

To construct the equivalent circuit, the metallic tracks were divided into rectangular block (for example, blocks A, B, D and E in FIGS. 11A to 11C). Current induced by the electromagnetic resonance passes through these parts. The corresponding auto-inductances $L_A$, $L_B$, $L_D$ and $L_E$ and the mutual inductances $M_{AB}$ and $M_{ED}$ were calculated. For this calculation, the thickness of skin (penetration of the electromagnetic field in the metal) was considered to be minimal relative to the dimensions of the structure. This approximation is justified in the domain of high frequencies, where the thickness of skin is a few tens of nanometers at most. It is possible to estimate the values of $L_A$, $L_B$, $L_D$ and $L_E$ and $M_{AB}$ and $M_{ED}$ as a function of the geometric parameters of the structure by using equations (8) and (18) of the reference Hoer, C. and C. Love, "Exact inductance equations for rectangular conductors with application to more complicated geometries" J. Res. NBS, Vol. 69C, No. 2, 127-137, (1965).

The capacitances $C_1$ and $C_2$ are estimated according to the formula:

$$C_1 = C_2 = \varepsilon\varepsilon_0 \frac{WY}{T} + \frac{\varepsilon\varepsilon_0 W}{\pi}\left(1 + \ln\left(\frac{2\pi Y}{T}\right)\right) + \frac{\varepsilon\varepsilon_0 Y}{\pi}\left(1 + \ln\left(\frac{2\pi W}{T}\right)\right)$$

In this formula, the second and third terms take into account "the leakage fields" or again the curvatures of lines of electrical field between the parts 51 and 31 (52 and 32), according to the results of Palmer (H. B. Palmer, "Capacitance of a parallel-plate capacitance by the Schwartz-Christoffel transformation", Trans. AIEE, Vol. 56, pp. 363, March 1927.)

The capacitance $C_{fringe}$ takes into account field lines between the parts 51 and 52. This capacitance can be estimated according to the analytical formulas given in the reference "Inder Bahl, Lumped Elements for RF and Microwave Circuits", 2003 ARTECH HOUSE, INC. 685 Canton Street Norwood, Mass. 02062, page 458, by the equations 14.47 a, 14.47b, 14.48:

The resonant frequency $f_{res}$ is given by the formula:

$$f_{res} = \frac{1}{\sqrt{(L_A + L_B + L_D + L_E - 2M_{AB} - 2M_{DE}) \times (C_{fringe} + C_1 C_2/(C_1 + C_2))}}$$

The values estimated according to this model are shown in FIG. 10 in continuous lines. The two methods reproduce the measured resonance frequencies. The advantage of the analytical model is that it estimates $f_{res}$ without utilising digital simulations which require several hours and a large quantity of computer memory.

Figure 12:
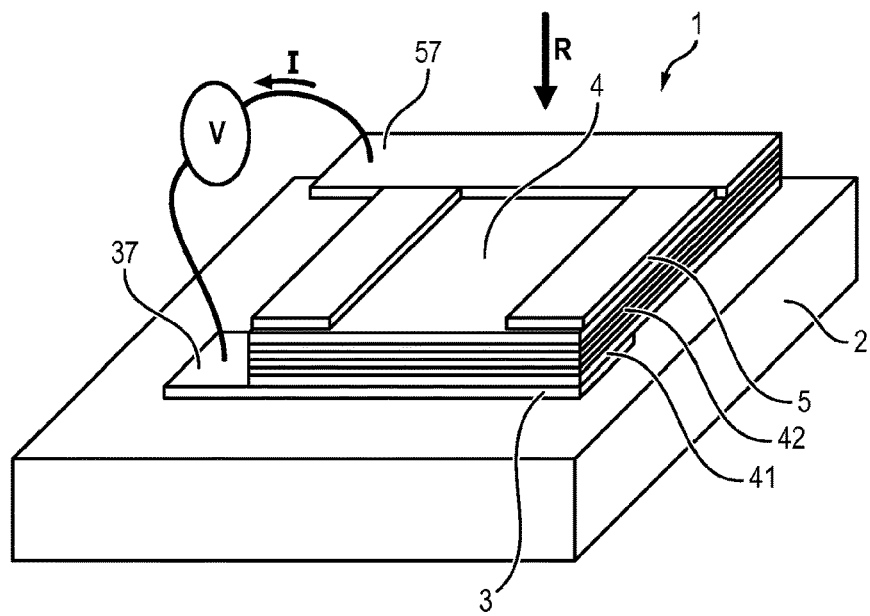

FIG. 12 schematically illustrates a resonator device comprising a first quantum structure.

The resonator device 1 illustrated in this Figure is identical to that of FIG. 1, except that the separating layer 4 is formed in its entirety by a quantum heterostructure arranged between the first conductive track 3 and the second conductive track 5.

The quantum heterostructure comprises a stack of layers formed from different materials. The quantum heterostructure illustrated in FIG. 12 comprises a stack of layers 41 of a first semi-conductor material and layers 42 of a second semi-conductor material, different to the first material. The layers 41 of the first material are positioned alternately with the layers 42 of the second material. Each layer 41, 42 of the stack extends parallel to the faces 43 and 45 of the separating layer 4. In other words, each layer 41, 42 of the stack extends perpendicularly to the direction of the thickness of the separating layer 4.

The first and the second materials can for example be selected from: GaAs and $Ga_{1-x}AlAs$, GaAs and AlGeAs, InAs and AlSb, GaN.

Also, the first track 3 comprises a first extension part 37 and the second track 5 comprises a second extension part 57. The first extension part 37 and the second extension part 57 connect the conductive tracks 3 and 5 to a voltage source V to excite the quantum transitions in the heterostructure. The first extension part 37 extends into the extension of the first track 3. The second extension part 57 extends into the extension of the transversal branch 54 of the second track 5.

The heterostructure is suitable for absorbing electromagnetic radiation R in a given frequency band and converting it to continuous electrical current I (or photocurrent). The extension parts 37 and 57 of the first track 3 and of the second track 5 can be connected to a current detector to detect the electrical current I generated by the resonator device 1.

Figure 13:
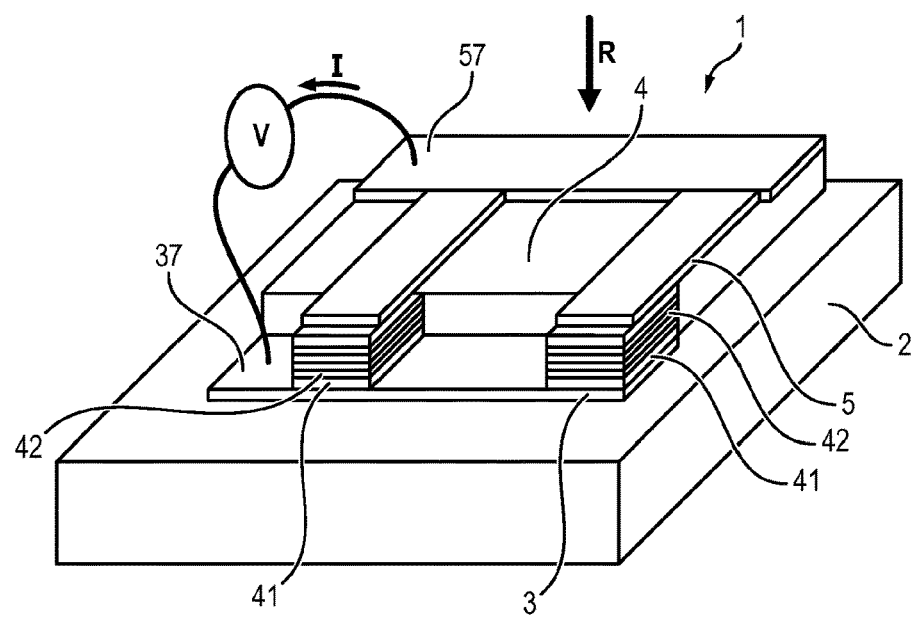

FIG. 13 schematically illustrates a resonator device 1 comprising a second quantum structure.

The resonator device 1 illustrated on this figure is identical to that of FIG. 1, except that the separating layer 4 comprises quantum heterostructures arranged in the capacitive zones only, i.e., between the parts 31 and 51, 32 and 52 of the first conductive track 3 and of the second conductive track 5 which overlap. The rest of the separating layer 4 is formed of insulating material. The advantage of this arrangement is that the photo-current is collected below the zones 31/51 and 32/52 only, in which the electrical field is particularly strong.

Figure 14:
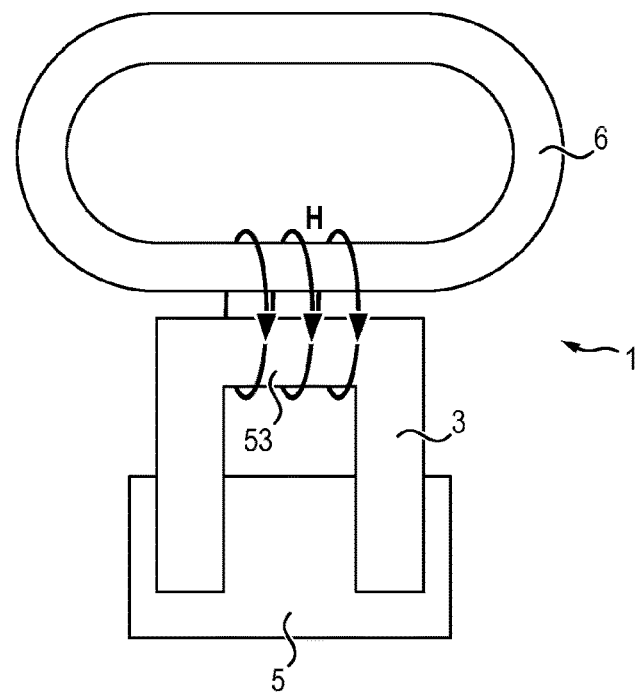

FIG. 14 schematically illustrates a resonator device 1 comprising a first antenna coupled inductively to a track of the resonator device.

The first antenna comprises a third conductive track 6 formed on the second face 45 of the separating layer 4, and arranged so as to be coupled inductively with the part in the form of a loop 53 of the second track 5. The first antenna boosts the coupling efficacy of the resonator device 1 with the incident electromagnetic radiation R.

Figure 15:
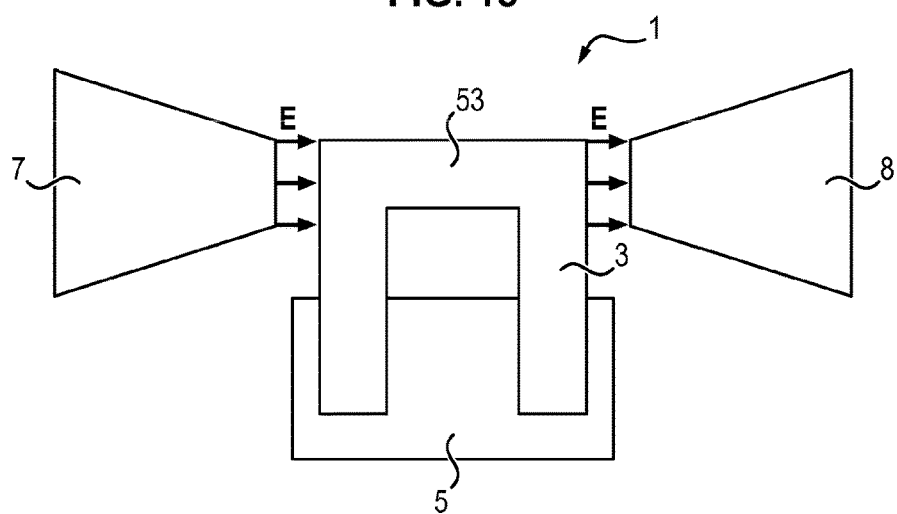

FIG. 15 schematically illustrates a resonator device 1 comprising a second antenna coupled capacitively with a track of the resonator device.

The second antenna comprises a fourth 7 and a fifth 8 conductive track formed on the second face 45 of the separating layer 4, and arranged so as to be coupled capacitively with the part in the form of a loop 53 of the second track 5.

OTHER EMBODIMENTS

Figure 16:
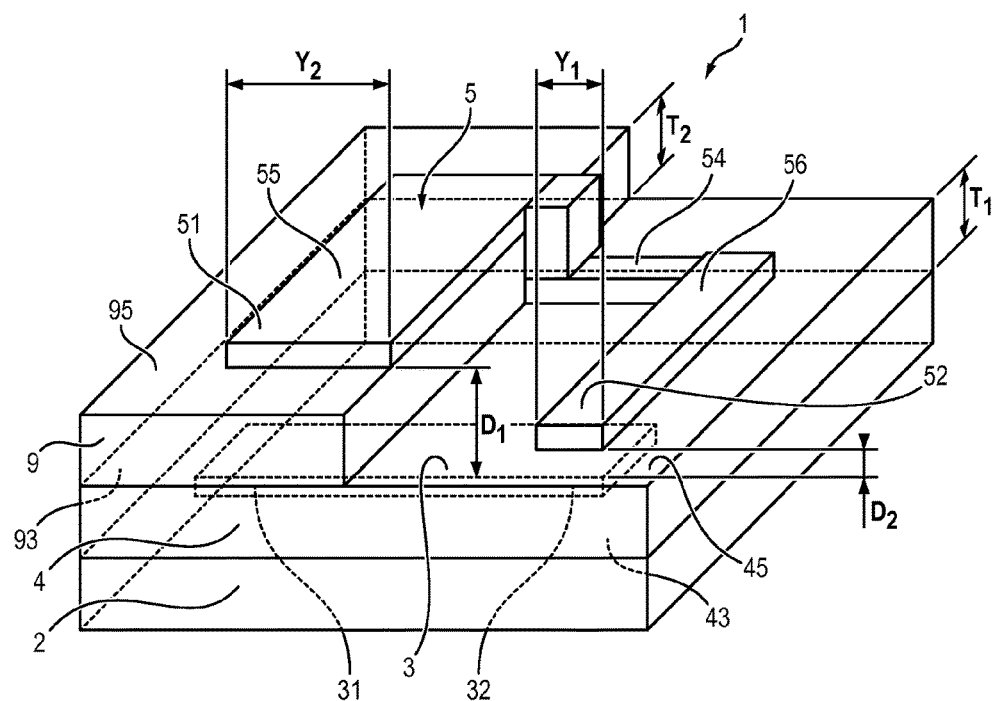
Figure 26A:
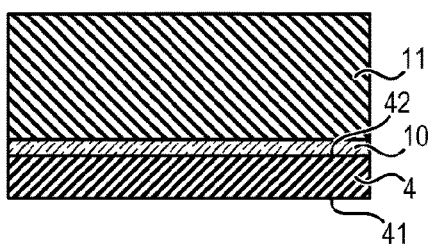
Figure 26B:
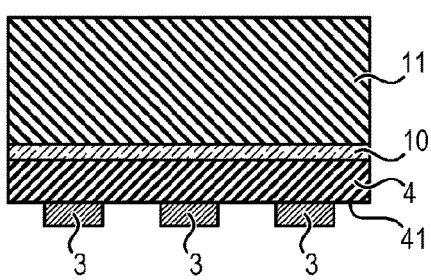
Figure 26C:
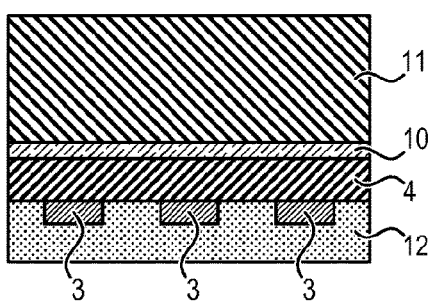
Figure 26D:
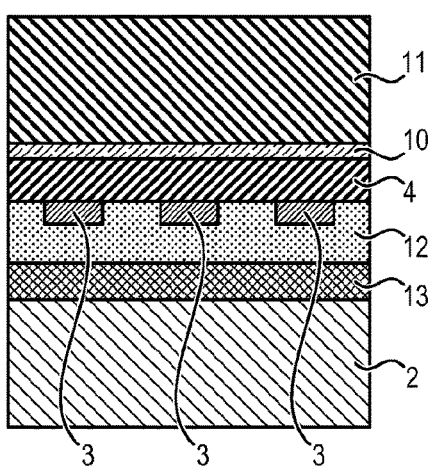
Figure 26E:
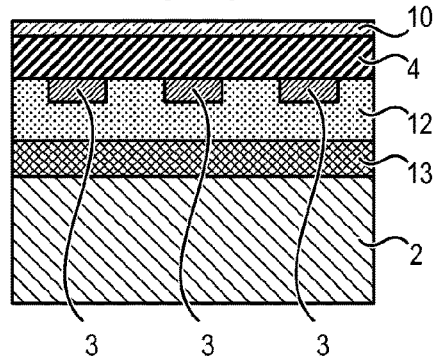
Figure 26F:
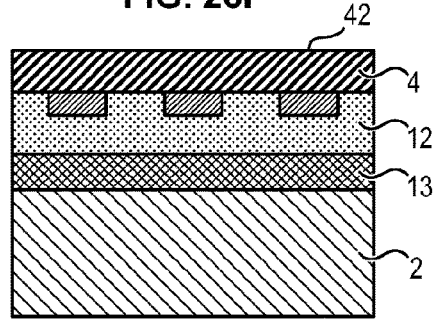
Figure 26G:
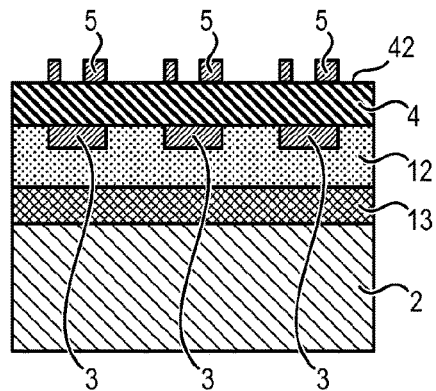

FIG. 16 schematically illustrates a resonator device 1 according to a second embodiment of the invention.

In this second embodiment, the resonator device 1 comprises a first separating layer 4 and a second separating layer 9. The second separating layer 9 extends on the first separating layer 4. However, the second separating layer 9 has dimensions different to the dimensions of the first separating layer 4.

The second separating layer has a first face 93 and a second face 95, opposite the first face 93. The second separating layer 9 covers the first separating layer 4, the first face 93 of the second separating layer 9 being in contact with the second face 45 of the first separating layer 4.

The first track 3 is formed on the first face 43 of the first separating layer 4, whereas the second track 5 is formed in part on the second face 95 of the second separating layer 9 and in part on the second face 45 of the first separating layer 4.

More precisely, the second track 5 comprises a transversal branch 54 and two parallel longitudinal branches 55, 56, including a first longitudinal branch 56 extending on the second face 45 of the first separating layer 4 and a second longitudinal branch 55 extending on the second face 95 of the second separating layer 9.

The first track 3 and the second track 5 are positioned one relative to the other such that the first end part 51 of the second track 5 overlaps the first end part 31 of the second track 3, and the second end part 52 of the second track 5 overlaps the second end part 32 of the first track 3.

However, the first end parts 31 and 51 are separates from each other by a first distance $D_1$, whereas the second end parts 32 and 52 are separated from each other by a second distance $D_2$, less than the first distance $D_1$. The first distance $D_1$ is equal to the thickness $T_1$ of the first separating layer 4. The second distance $D_2$ is equal to the sum of the thicknesses $T_1$ and $T_2$ of the first separating layer 4 and of the second separating layer 9.

Also, the second conductive track 5 has an asymmetrical form. The dimensions of the second longitudinal branch 55 are different to the dimensions of the first longitudinal branch 56. In particular, the second longitudinal branch 55 has a width $Y_1$ greater than the width $Y_2$ of the first longitudinal branch 56.

FIGS. 17 to 25 schematically illustrate different other embodiments of a resonator device 1 according to the invention, In FIG. 17, the first conductive track 3 has a rectilinear form. The second conductive track 5 has an arched form.

In FIG. 18, the first conductive track 3 and the second conductive track 5 each exhibit a U-shape. The first track 3 and the second track 5 are positioned one relative to the other such that only the end parts 31 and 51, 32 and 52 of tracks 3 and 5 overlap.

In FIG. 19, the first conductive track 3 has a rectilinear form. The second conductive track 5 has a C-shape.

In FIG. 20, the first conductive track 3 has a rectilinear form. The second conductive track 5 has a part 53 in the form of an open rectangular loop and two longitudinal branches 55, 56 extending from the part in the form of a loop 53. Each longitudinal branch 55, 56 has an end part 51, 52 which overlaps a respective end part 31, 32 of the first track 3.

In FIG. 21, the device comprises two first rectilinear conductive tracks 3 and 3' and a second conductive track 5 in an H-shape. The first conductive tracks 3 and 3' extend parallel to each other. The second conductive track 5 comprises two parts in the form of a loop 53 and 53' having a common transversal branch 54 and four longitudinal branches 55, 56, 55', 56' extending perpendicularly to the transversal branch 54. Each longitudinal branch 55, 56, 55', 56' has an end part 51, 52, 51', 52'. The first tracks 3, 3' and the second track 5 are arranged relative to each other such that each end part 51, 52, 51', 52' of the second track 5 overlaps a respective end part 31, 32, 31', 32' of one of the first tracks 3, 3'.

In FIG. 22, the device also comprises two first rectilinear conductive tracks 3 and 3', and a second conductive track 5. The first conductive tracks 3, 3' extend parallel to each other. The first tracks 3 and 3' have different lengths. The second track 5 comprises two parts in the form of a loop 53 and 53' having a common transversal branch 54 and four longitudinal branches 55, 56, 55', 56' extending from the transversal branch 54. More precisely, the second track 5 has a first pair of longitudinal branches 55, 56 and a second pair of longitudinal branches 55', 56'. The longitudinal branches 55, 56 of the first pair are spaced apart from each other by a first distance $L_{x1}$. The longitudinal branches 55', 56' of the second pair are spaced apart from each other by a second distance $L_{x2}$. The first tracks 3, 3' and the second track 5 are arranged relative to each other such that the end parts 51, 52 of the branches 55, 56 of the first pair overlap the end parts 31, 32 of one of the first tracks 3 and the end parts 51', 52' of the branches 55', 56' of the second pair overlap the end parts 31', 32' of the other first track 3'.

In FIG. 23, the device comprises two first rectilinear tracks 3 and 3', and two second tracks 5 and 5' in U-shape. Each second track 5, 5' has end parts 51, 52, and 51', 52' which overlap the end parts 31, 32, and 31', 32' of one of the first tracks 3, 3'. The first tracks 3 and 3' are identical together, but are positioned perpendicularly to relative to each other. Similarly, the second tracks 5, 5' are identical together but are turned by 90 degrees relative to each other.

In FIG. 24, the device comprises a first rectilinear track 3 and a second track 5 in a U-shape. The second track 5 comprises a transversal branch 54 and two parallel longitudinal branches 55, 56. The longitudinal branches 55, 56 have widths $Y_1$ and $Y_2$ different to each other. The first track 3 and the second track 5 are positioned one relative to the other such that the first end part 51 of the second track 5 overlaps the first end part 31 of the first track 3, and the second end part 52 of the second track 5 overlaps the second end part 32 of the first track 3.

In FIG. 25, the device comprises a first track 3 in L-shape having a transversal branch 34 and a longitudinal branch 35. The longitudinal branch 35 of the first track 3 in part overlaps one of the longitudinal branches 55 of the second track 5. The end part 32 of the transversal branch 34 of the first track 3 overlaps the end part 52 of the other longitudinal branch 56 of the second track 5.

FIGS. 26A to 26G schematically illustrate steps of a manufacturing process of a resonator device according to the invention.

According to a first step (illustrated in FIG. 26A), a stop layer 10 and a separating layer 4 are formed on a first substrate layer 11.

The first substrate layer 11 is made of gallium arsenide (GaAs) and has a thickness of 300 µm.

The stop layer 10 is formed of aluminium-gallium arsenide (AlGaAs). The stop layer 10 extends between the first substrate 11 and the separating layer 4.

The separating layer 4 comprises for example a heterostructure formed from alternating layers of GaAs—$Al_xGa_{1-x}As$ of respective thicknesses 100 nm and 2 µm.

According to a second step (illustrated in FIG. 26B), one or more first conductive track(s) 3 is(are) formed on the first face 41 of the separating layer 4.

The first conductive track(s) 3 are formed from an alloy of gold and titanium, by optical lithography or electronic lithography.

According to a third step (illustrated in FIG. 26C), a layer of dielectrical material 12 is deposited onto the separating layer 4, for example by Plasma-Enhanced Chemical Vapor Deposition (PECVD). The dielectrical material can be silicon dioxide ($SiO_2$) or silicon nitride (SiN).

Once the layer of dielectrical material 12 is deposited, the first conductive tracks 3 are embedded in the layer of dielectrical material 12.

According to a fourth step (illustrated in FIG. 26D), the assembly formed from the first substrate 11, the stop layer 10, the separating layer 4, the first tracks 3 and the layer of dielectrical material 12, is stuck onto a second substrate 2.

For this purpose, the layer of dielectrical material 12 is coated with a layer 13 of adhesive composition to which the second substrate 2 is attached.

The adhesive composition 13 can be a composition based on epoxy for example.

The second substrate layer 2 is formed from gallium arsenide (GaAs). The second substrate layer 2 is intended to later form the substrate 2 of the resonator device(s).

According to a fifth step (illustrated in FIG. 26E), the first substrate layer 11 is eliminated by selective etching with citric acid. The stop layer 10 limits the etching so as to eliminate the first substrate layer 11 only.

According to a sixth step (illustrated in FIG. 26F), the stop layer 10 is eliminated by selective etching in aqueous solution of hydrofluoric acid.

According to a seventh step (illustrated in FIG. 26G), one or more second conductive track(s) 5 is(are) formed on the second face 42 of the separating layer 4, opposite the first face 41.

The second conductive track(s) 5 are formed from an alloy of gold and titanium, by optical lithography or electronic lithography.

The process collectively produces many resonator devices 1.

For applications of this type of structure, it is important to be able to optimise the coupling of incident light with the mode of the structure. The capacitance of the structure to interact with the incident radiation is given by a quantity J:

$$J=\int E_{planar} d^2 S$$

This quantity illustrates the whole projection of the electrical field generated at the electromagnetic resonance in the plane of the structure, to the side of the incident electromagnetic wave. This quantity can be assimilated with the sum of the arrows (representative of the field $E_{planar}$) in FIGS. 31 and 32.

Figure 31:
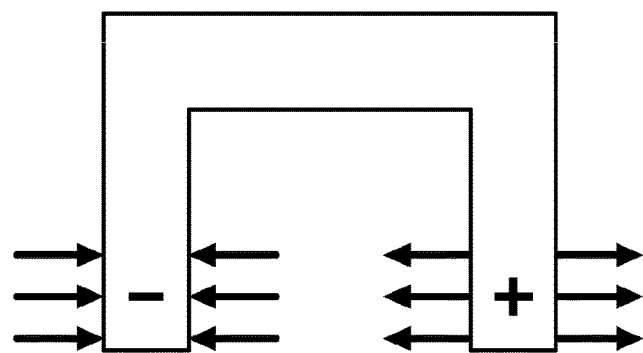

In FIG. 31 the vectorial sum of all the arrows is cancelled out, and the sum J is low.

Figure 32:
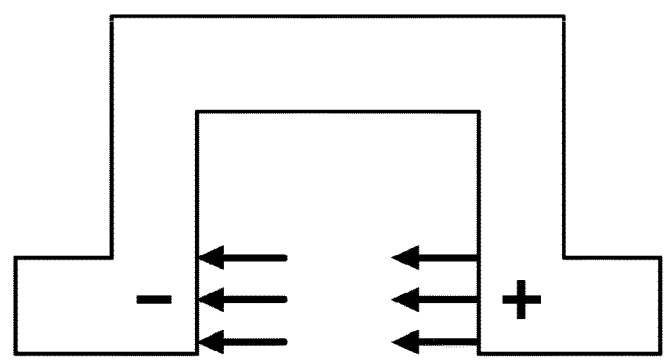

Adding extension to the part 5 beyond the coverage zones 51 and 52 as in FIG. 32, it minimises the components of the field $E_{planar}$ in counter-phase and increases J.

Figure 33:
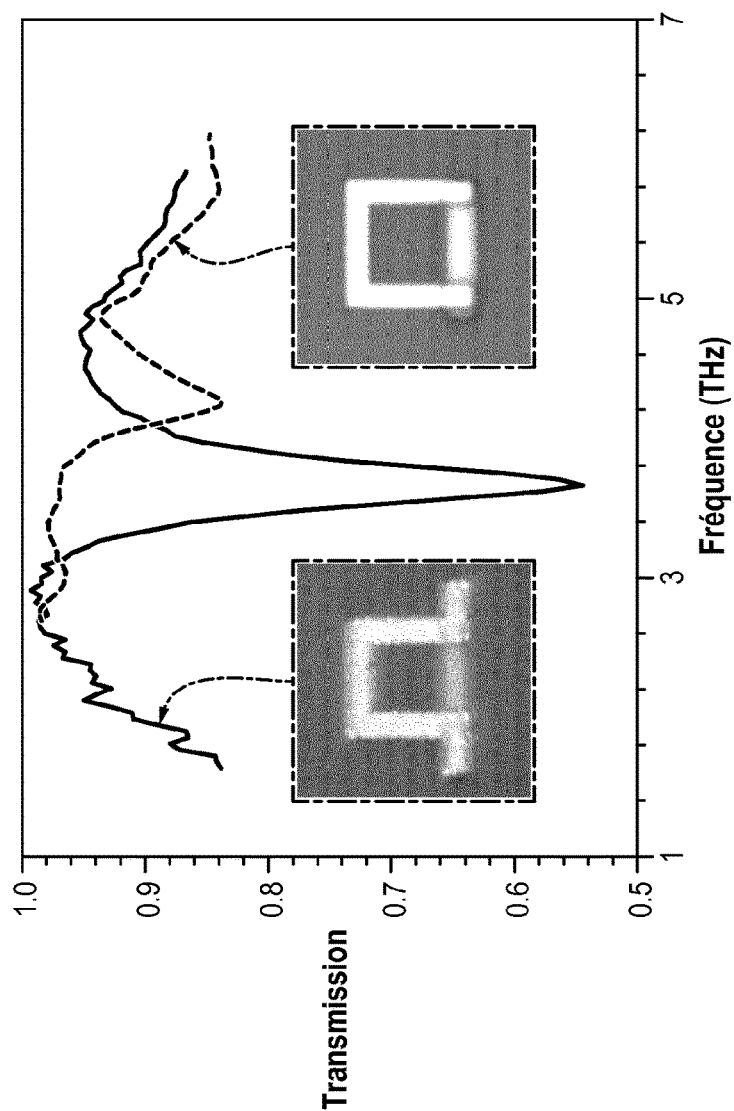
FIG. 33 illustrates the transmission spectra of network of resonators according to the realisations of FIGS. 31 and 32.

The experimental verification of this effect is given in FIG. 33. In this figure, compare the transmission of the two structures as described in FIGS. 31 and 32. The resonance corresponding to the structure with extensions of the loop 5 has an amplitude far stronger than the resonance of the structure without extensions, showing that the quantity J has been increased.

Figure 34A:
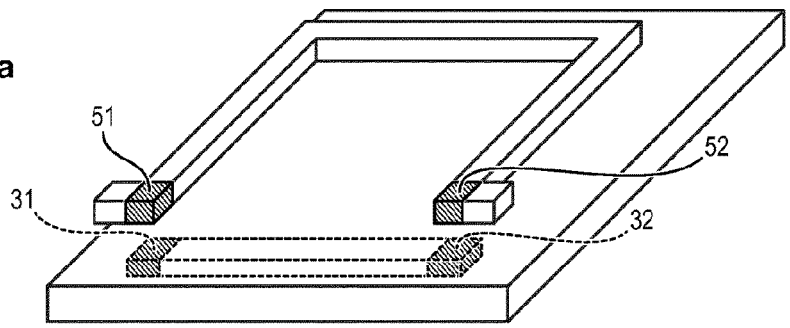
FIGS. 34A to 34C illustrates a ticket diagram of the embodiment of FIG. 32, with simulations of the electrical and magnetic field.

FIG. 34a is a diagram of a structure with extensions which shows the arrangement of the two metallic tracks, and the covering zones 31, 32 and 51, 52.

Figure 34B:
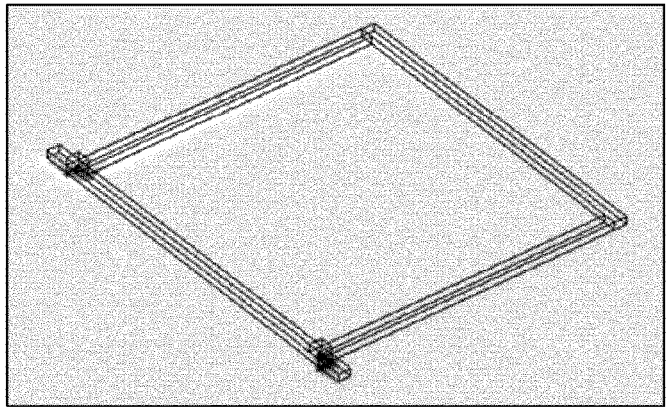

FIG. 34b is a simulation of the vertical electrical field $E_z$ of a structure of this type when the latter is excited by resonance. These simulations show that the field is well located in the covering zones between 31/51 and 32/52 indicated in 34a.

Figure 34C:
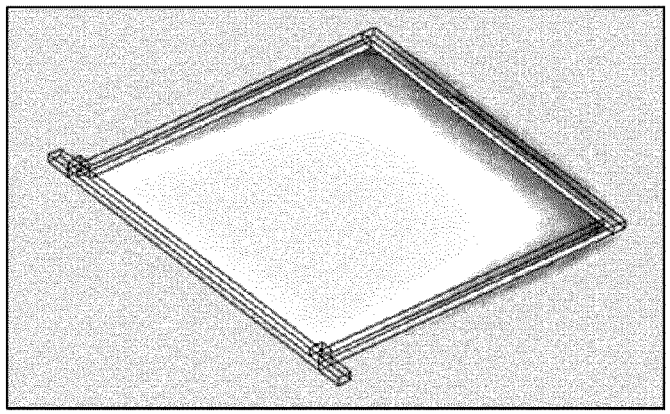

FIG. 34c is a simulation of the vertical magnetic field Hz of the structure. The field is located mainly in the inductive loop.

FIG. 35 shows prototypes of resonators with reduced capacitive size. FIGS. 35a, 34b and 35c are realisations with metallic tracks having dimensions respectively W=Y=1 μm (35a), W=Y=0.5 μm (35b) and W=Y 0.35 μm (35c). The dielectrical layers are made of $SiO_2$ whereof the thicknesses are respectively T=1 μm (35a), T=0.5 μm (35b) and T=0.25 μm (35c). In this way, the volume of each capacitance indicated by a square in the figures is W×Y×T=1 μm³ (34a), W×Y×T=0.125 μm³ (35b) and W×Y×T=0.03 μm³ (35c). The inductive loops for each structures are (width $L_x$×length $L_y$): 4 μm×6 μm (35a), 4 μm×8 μm (35b); 6 μm×6 μm (35c).

The transmission spectra of a periodic assembly of identical resonators are shown in FIG. 35d for 35a, 35e for 35b and 35f for 35c. The number indicated for each transmission curve indicates the surface of the elementary cell for each network of resonators. The sizes of the inductive loops have been selected such that all the resonators have a mode at a frequency of 3 THz, with a wavelength $\lambda_{res}$=100 μm. So for the structure of 35c, a ratio $\lambda_{res}^3/V_c$=3,3*10^7 has been achieved.

The invention claimed is:

1. A three-dimensional electromagnetic resonator device of inductance-capacitance type, having a given resonant frequency greater than or equal to 100 gigahertz, comprising a first track made of conductive material and a second track made of conductive material formed respectively on either side of a separating layer which is a quantum heterostructure arranged between the first track and the second track, the first track having two overlapping parts, and the second track having two overlapping parts and an inductive loop connecting the two overlapping parts, each overlapping part of the first track being positioned facing a respective overlapping part of the second track so as to form two capacitances spaced apart spatially from each other, the inductive loop being suitable for generating a magnetic field inside the inductive loop and around the tracks, and each capacitance being suitable for generating an electrical field inside the separating layer, wherein the first track and the second track are:
finished;
positioned one relative to the other such that the overlapping parts are first end parts and second end parts of an intermediate part of the first track and longitudinal branches of the second track;
the two first end parts forming a first capacitance and the two second end parts form a second capacitance suitable for generating a sign electrical field opposite the electrical field generated by the first capacitance;
to confine the electrical field in the overlapping parts, when the device is excited at the resonant frequency.

2. The device according to claim 1, wherein the magnetic field generated by the inductive loop in the separating layer has a main component extending in a direction parallel to the electrical field generated by the capacitances.

3. The device according to claim 2, wherein the electrical field generated by each capacitance extends in a direction parallel to the direction of the thickness of the separating layer.

4. The device according to claim 3, wherein at least 70% of the electrical energy generated by the electrical field is located in zones of the separating layer located between the overlapping parts of the first track and of the second track.

5. The device according to claim 1, wherein the overlapping parts of the second track are spaced apart from each other by a spacing distance, the inductive loop has a longitudinal dimension, each overlapping part has a length and a width and wherein Lx+2Y and Ly+W+Y are less than the wavelength of the resonance $\lambda$ defined as being equal to $c/f_{res}$, where c is the speed of light in the vacuum and $f_{res}$ is the resonant frequency of the device.

6. The device according to claim 1, wherein the separating layer has a thickness of less than $\lambda/2n$, where n is the refraction index of the separating layer (4) and $\lambda$ is the resonance wavelength, $\lambda$ being equal to $c/f_{res}$, where c is the speed of light in the vacuum and $f_{res}$ the resonant frequency of the device.

7. The device according to claim 1, wherein the longitudinal branches of one of the tracks have lateral extensions.

8. The device according to claim 1, wherein each zone of the separating layer located between an overlapping part of the first track and an overlapping part of the second track forming a capacitance has a volume less than or equal to $(\lambda/2n)^3$, where n is the refraction index of the separating layer and $\lambda$ is the resonance wavelength, $\lambda$ being equal to $c/f_{res}$, where c is the speed of light in the vacuum and $f_{res}$ is the resonant frequency of the device.

9. The device according to claim 1, wherein the first conductive track (3) has a rectilinear form.

10. The device according to claim 1, wherein the dimensions and the positioning of the capacitances and those of the inductive loop separate spatially at the resonant frequency, along a median plane of the separating layer, perpendicularly to a direction of the thickness of the separating layer, main components of the electrical fields and of the magnetic field extending along the direction of the thickness.

11. The device according to claim 1, wherein the second conductive track has a U shape having two parallel branches, the overlapping parts being located at the respective ends of the U-shaped branches.

12. The device according to claim 1, wherein the second track has an asymmetrical form.

13. The device according to claim 1, wherein the device comprises at least a third track arranged with the first and second tracks to present a number pair p of capacitances with p greater than or equal to 4.

14. The device according to claim 1, comprising a metallic pattern coupled capacitively or inductively with the second conductive track, the metallic pattern being suitable for collecting electromagnetic radiation lighting the device.

15. An electrical resonator assembly, comprising a plurality of devices according to claim 1, a first electrical conductor electrically connecting the first tracks together and a second electrical conductor connecting the second tracks together.

* * * * *